United States Patent
Bundschuh et al.

(10) Patent No.: US 8,446,042 B2
(45) Date of Patent: May 21, 2013

(54) PHOTOVOLTAIC ARRAY SYSTEMS, METHODS, AND DEVICES WITH IMPROVED DIAGNOSTICS AND MONITORING

(75) Inventors: Paul A. Bundschuh, Austin, TX (US); William C. Alexander, Spicewood, TX (US)

(73) Assignee: Ideal Power Converters, Inc., Spicewood, TX (US)

( * ) Notice: Subject to any disclaimer, the term of this patent is extended or adjusted under 35 U.S.C. 154(b) by 0 days.

(21) Appl. No.: 13/308,200

(22) Filed: Nov. 30, 2011

(65) Prior Publication Data
US 2013/0038129 A1 Feb. 14, 2013

Related U.S. Application Data

(60) Provisional application No. 61/418,144, filed on Nov. 30, 2010, provisional application No. 61/480,048, filed on Apr. 28, 2011.

(51) Int. Cl.
*H02J 1/00* (2006.01)
(52) U.S. Cl.
USPC .......................................... 307/80; 307/151
(58) Field of Classification Search
USPC ....................... 307/64, 80, 85, 151
See application file for complete search history.

(56) References Cited

U.S. PATENT DOCUMENTS

| | | |
|---|---|---|
| 4,068,277 A | 1/1978 | Simokat |
| 4,331,994 A | 5/1982 | Wirth |
| 4,616,300 A | 10/1986 | Santelmann, Jr. |
| 4,730,242 A | 3/1988 | Divan |
| 4,942,511 A | 7/1990 | Lipo et al. |
| 4,992,919 A | 2/1991 | Lee et al. |
| 5,010,471 A | 4/1991 | Klaassens et al. |
| 5,127,085 A | 6/1992 | Becker et al. |
| 5,189,603 A | 2/1993 | Sashida et al. |
| 5,208,740 A | 5/1993 | Ehsani |
| 5,363,020 A | 11/1994 | Chen et al. |

(Continued)

FOREIGN PATENT DOCUMENTS

| | | |
|---|---|---|
| EP | 1691246 A2 * | 8/2006 |
| JP | 2002-091586 A | 3/2002 |

(Continued)

OTHER PUBLICATIONS

International Search Report for PCT/US201/062689 from KIPO.

(Continued)

*Primary Examiner* — Fritz M Fleming
(74) *Attorney, Agent, or Firm* — Robert O. Groover, III; Gwendolyn S. S. Groover; Groover and Associates PLLC

(57) ABSTRACT

Devices, systems and methods for operating, monitoring and diagnosing photovoltaic arrays used for solar energy collection. The system preferably includes capabilities for monitoring or diagnosing an array by automatically disconnecting portions of the array during normal service (when load is not maximum, and observing the resulting change in electrical characteristics. More intensive diagnostic procedures can be launched if needed. One embodiment provides for performing monitoring or diagnostic operations on the array in daylight or at night. Another embodiment allows monitoring or diagnostic operations to be performed on a portion of the array while other parts of the array continue to collect energy. Yet another embodiment provides a safety mode for an array for maintenance or during emergencies.

4 Claims, 24 Drawing Sheets

Diagnostics with String Disconnects
Opens all strings disconnects except for string under test

U.S. PATENT DOCUMENTS

| | | | |
|---|---|---|---|
| 5,412,557 | A | 5/1995 | Lauw |
| 5,500,791 | A | 3/1996 | Kheraluwala et al. |
| 5,903,448 | A | 5/1999 | Davila, Jr. |
| 5,977,569 | A | 11/1999 | Li |
| 6,093,885 | A * | 7/2000 | Takehara et al. ............... 136/244 |
| 6,118,678 | A | 9/2000 | Limpaecher et al. |
| 6,166,930 | A | 12/2000 | Czerwinski |
| 6,195,505 | B1 | 2/2001 | Van Alstyne |
| 6,226,162 | B1 | 5/2001 | Kladar et al. |
| 6,246,219 | B1 * | 6/2001 | Lynch et al. .................. 323/223 |
| 6,330,170 | B1 | 12/2001 | Wang et al. |
| 6,370,050 | B1 | 4/2002 | Peng et al. |
| 6,404,654 | B1 | 6/2002 | Wang |
| 6,424,133 | B1 | 7/2002 | Choi |
| 6,459,606 | B1 | 10/2002 | Jadric |
| 6,567,278 | B2 | 5/2003 | Rufer et al. |
| 6,984,965 | B2 | 1/2006 | Vinciarelli |
| 6,995,992 | B2 | 2/2006 | Wei et al. |
| 7,042,199 | B1 | 5/2006 | Birchenough |
| 7,057,905 | B2 | 6/2006 | Macmillan |
| 7,312,593 | B1 | 12/2007 | Streicher et al. |
| 7,499,290 | B1 | 3/2009 | Mazzola et al. |
| 7,643,265 | B2 | 1/2010 | Loader et al. |
| 7,760,517 | B2 | 7/2010 | Herty et al. |
| 7,786,709 | B2 | 8/2010 | Lawson et al. |
| 8,107,267 | B2 | 1/2012 | Tallam et al. |
| 8,149,596 | B2 | 4/2012 | Lee et al. |
| 8,289,736 | B2 | 10/2012 | Asplund |
| 2002/0059035 | A1 | 5/2002 | Yagi et al. |
| 2003/0122558 | A1 | 7/2003 | Hacke |
| 2003/0133317 | A1 | 7/2003 | Norrga |
| 2004/0080966 | A1 | 4/2004 | Chadwick et al. |
| 2005/0286271 | A1 | 12/2005 | Vinciarelli |
| 2006/0050538 | A1 | 3/2006 | Scheel et al. |
| 2006/0103341 | A1 | 5/2006 | Steigerwald et al. |
| 2007/0019451 | A1 | 1/2007 | Bushnell |
| 2007/0189044 | A1 | 8/2007 | Liu et al. |
| 2008/0013351 | A1 | 1/2008 | Alexander |
| 2008/0031019 | A1 | 2/2008 | Alexander |
| 2008/0049460 | A1 | 2/2008 | Mohan et al. |
| 2008/0147335 | A1 | 6/2008 | Adest et al. |
| 2008/0150484 | A1 | 6/2008 | Kimball et al. |
| 2008/0186742 | A1 | 8/2008 | Seong |
| 2009/0127448 | A1 | 5/2009 | Fuyuki |
| 2011/0012579 | A1 | 1/2011 | Huang |
| 2011/0057588 | A1 | 3/2011 | Rineh et al. |

FOREIGN PATENT DOCUMENTS

| | | | |
|---|---|---|---|
| JP | 2009-032743 | A | 2/2009 |
| WO | 2011/008567 | A2 | 1/2001 |
| WO | 2008/008143 | A3 | 1/2008 |

OTHER PUBLICATIONS

Written Opinion for PCT/US2011/062689 from KIPO.

Chen, D. et al., "Novel Current Mode AC/AC Converters with High Frequency AC Link," Power Electronics Specialists Conference, 2005. PESC '05. IEEE 36th, pp. 39-44, Jun. 16, 2005. doi: 10.1109/PESC.2005.1581599 URL: http://ieeexplore.ieee.org/stamp/stamp.jsp?tp=&arnumber=1581599&isnumber=33408.

Ehsani et al, "Inverse Dual Converter (IDC) for High-Power DC-DC Applications", IEEE Transactions on Power Electronics, vol. 8, No. 2, Apr. 1993, pp. 216-223.

Itoh, J. et al., "A novel control strategy for high-frequency AC-link AC/AC direct converter based on virtual converter system," Power Electronics and Applications, 2005 European Conference on, pp. 10 pp.-p. 10, 2005. doi:10:1109/EPE.2005.219395 URL: http://ieeexplore.ieee.org/stamp/stamp.jsp?tp=&arnumber=1665585&isnumber=34861.

K. Ngo, "Topology and Analysis in PWM Inversion, Rectification, and Cycloconversion", Dissertation, California Institute of Technology (1984).

Kheraluwala, et al., "Performance Characterization of a High-Power Dual Active Bridge DC-to-DC Converter", IEEE Transactions on Industry Applications, vol. 28, No. 6, Nov./Dec. 1992, pp. 1294-1301.

Kim, et al., "New Bilateral Zero Voltage Switching AC/AC Converter Using High Frequency Partial-resonant Link", Korea Advanced Institute of Science and Technology, Industrial Electronics Society, 1990 IECON '90., 16th Annual conference of IEEE, pp. 857-862 vol. 2, Nov. 27-30, 1990 doi: 10.1109/IECON.1990.149252 URL: http://ieeexplore.ieee.org/stamp/stamp.jsp?tp=&arnumber=149252.

Rajashekara et al., "Power Electronics", Chapter 30 in The Electrical Engineering Handbook (ed. R. Dorf 2000).

Sood, p. et al., "Power conversion distribution system using a high-frequency AC link," Industry Applications, IEEE Transactions on, vol. 24, No. 2, pp. 288-300, Mar./Apr. 1988 doi: 10.1109/28.2869 URL: http://ieeexplore.ieee.org/stamp/stamp.jsp?tp=&arnumber=2869&isnumber=164.

http://en.wikipedia.org/wiki/Push-Pull_Converter.

Yamamoto, S. et al., "Analysis of series-resonant AC link inverter for improving output current," Power Electronics Specialists Conference, PESC '94 Record, 25th Annual EIII, pp. 965-969 vol. 2, Jun. 20-25, 1994 doi: 10.1109/PESC.1994.373796 URL: http://ieeexplore.ieee.org/stamp/stamp.jsp?tp=&arnumber=373796&isnumber=8548.

International Searching Authority, International Application No. PCT/US2007/013552, International Search Report and Written Opinion, May 19, 2008.

International Searching Authority, International Application No. PCT/US2010/040504, International Search Report and Written Opinion, Feb. 17, 2011.

International Searching Authority, International Application No. PCT/US2010/045819, International Search Report and Written Opinion, May 23, 2011.

International Searching Authority, International Application No. PCT/US2011/062689, International Search Report and Written Opinion, Jul. 10, 2012.

International Searching Authority, International Application No. PCT/US2011/062710, International Search Report and Written Opinion, Jun. 5, 2012.

* cited by examiner

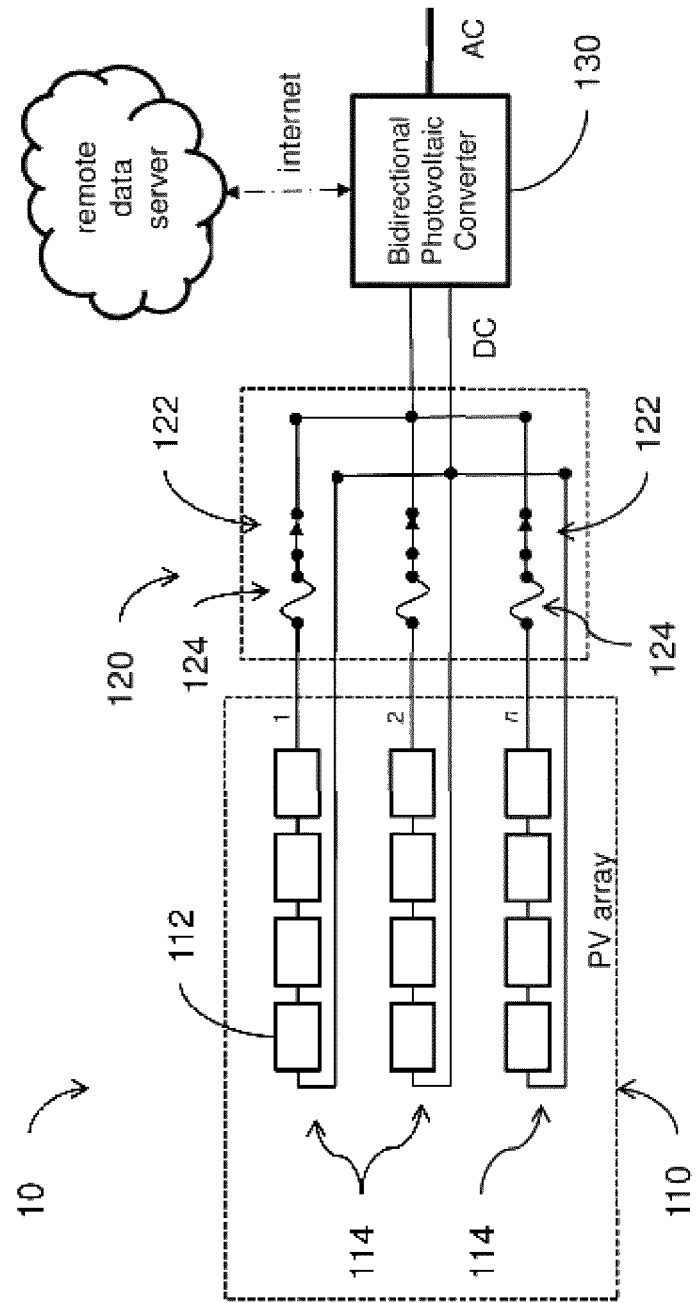
Figure 1. Embodiment of a PV System

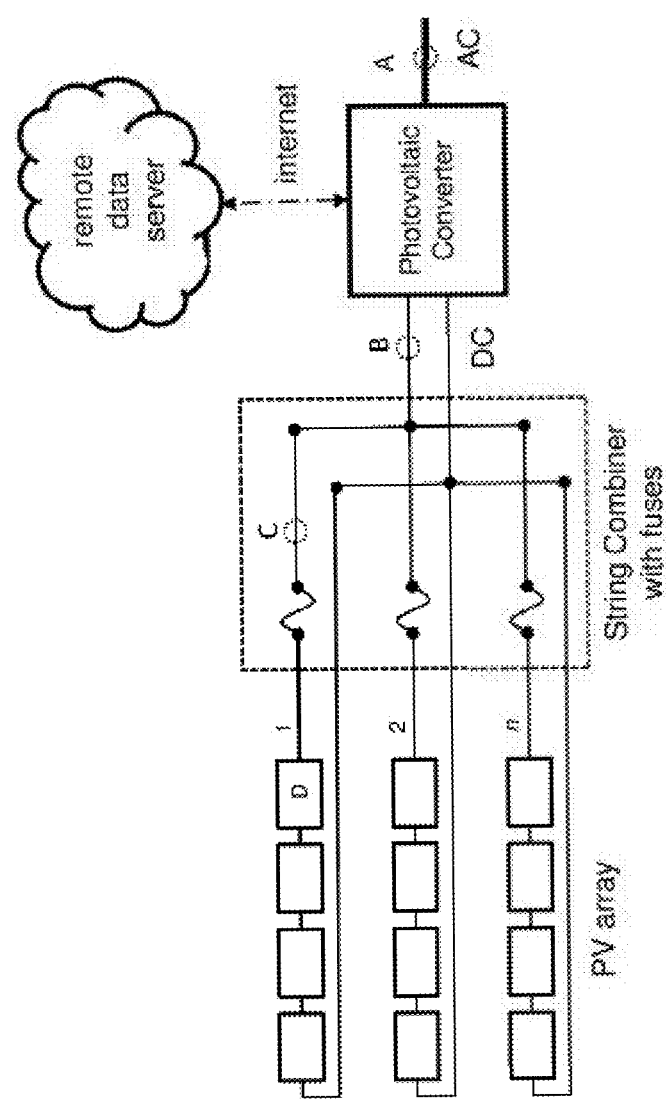
Figure 2. Measurement locations for Power Monitoring of a PV System

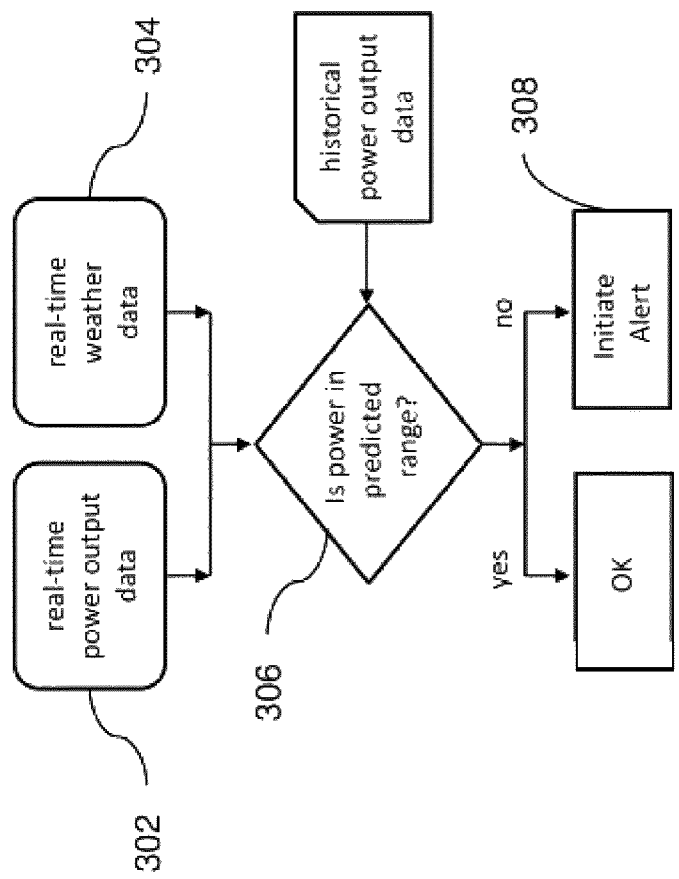
Figure 3. Power Monitoring

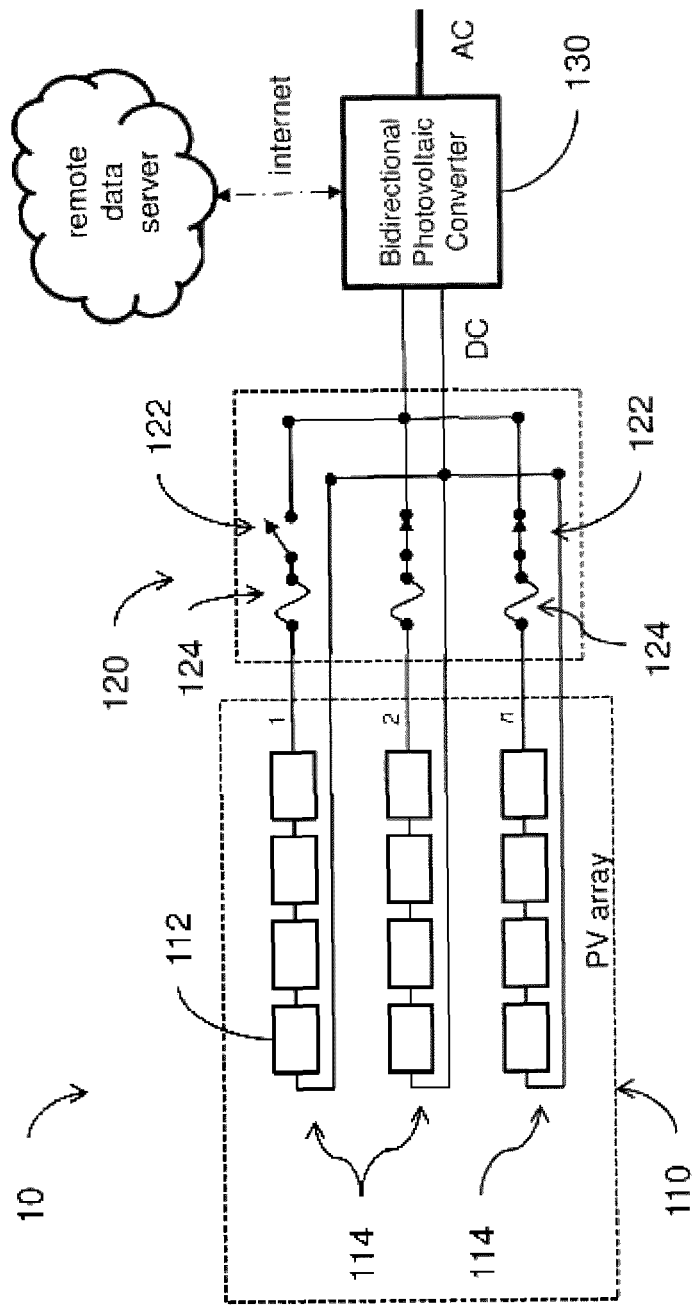
Figure 4. Power Monitoring with String Disconnects

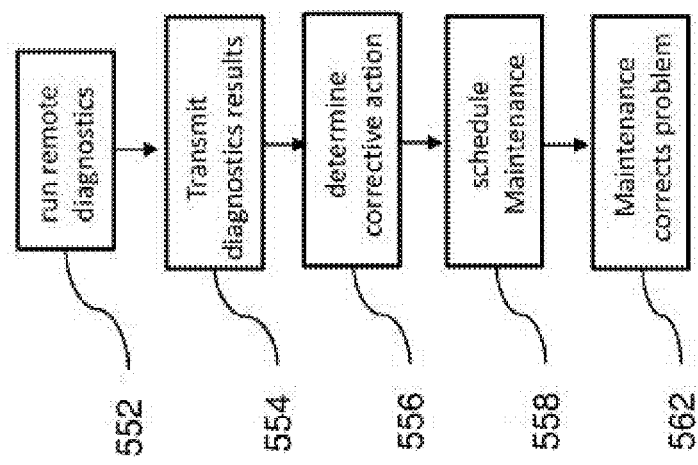
Figure 5B. Power Monitoring with automated diagnostics
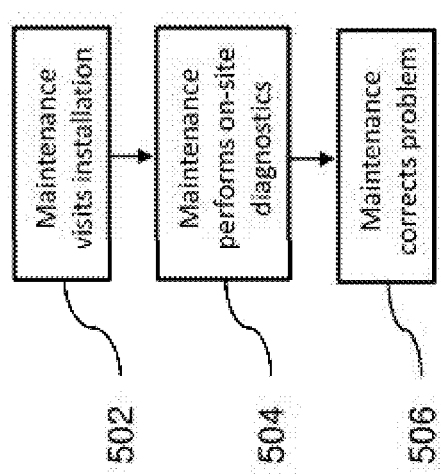
Figure 5A. Power Monitoring with Diagnostics Performed on Site with Maintenance staff
PRIOR ART

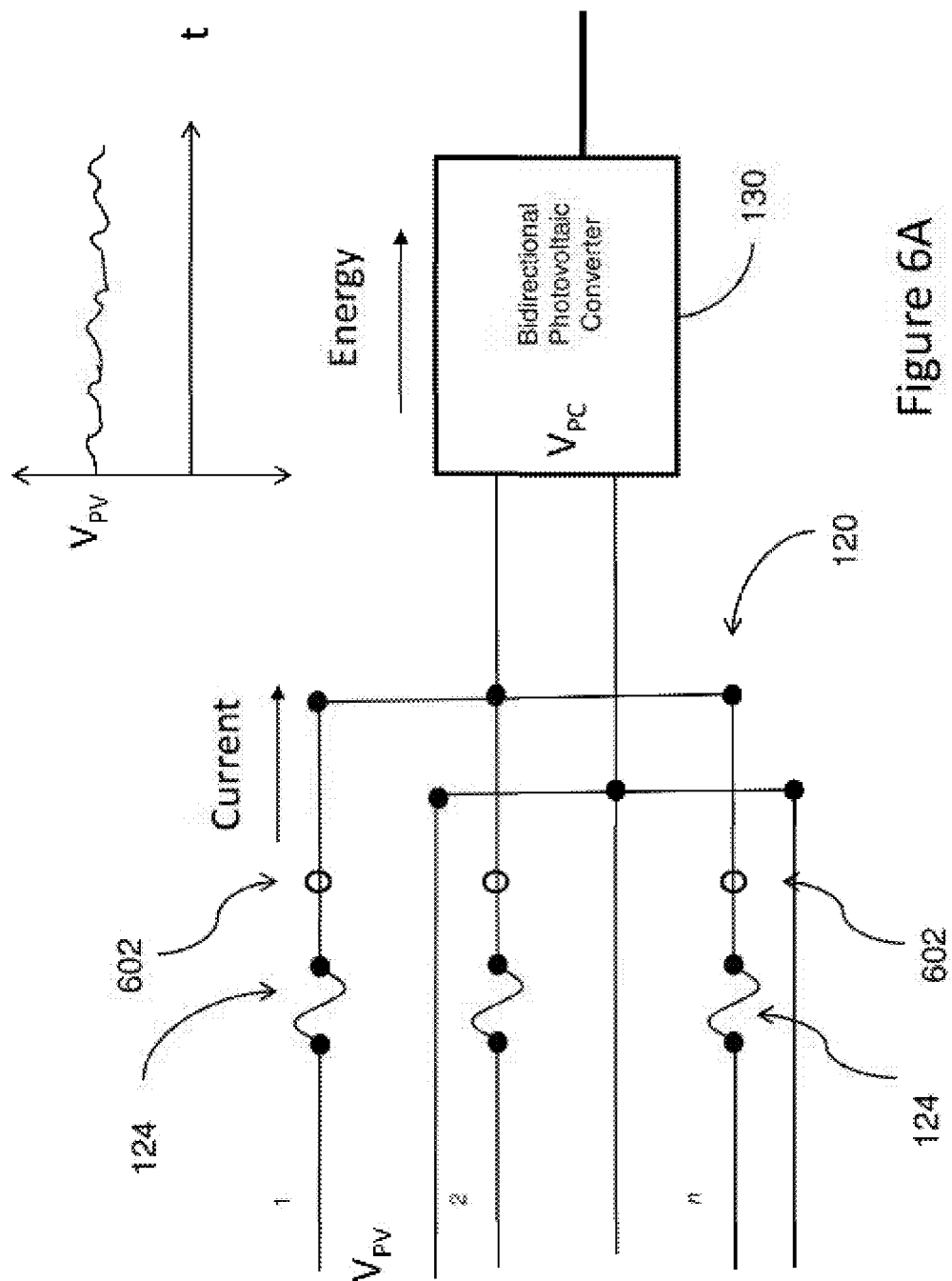

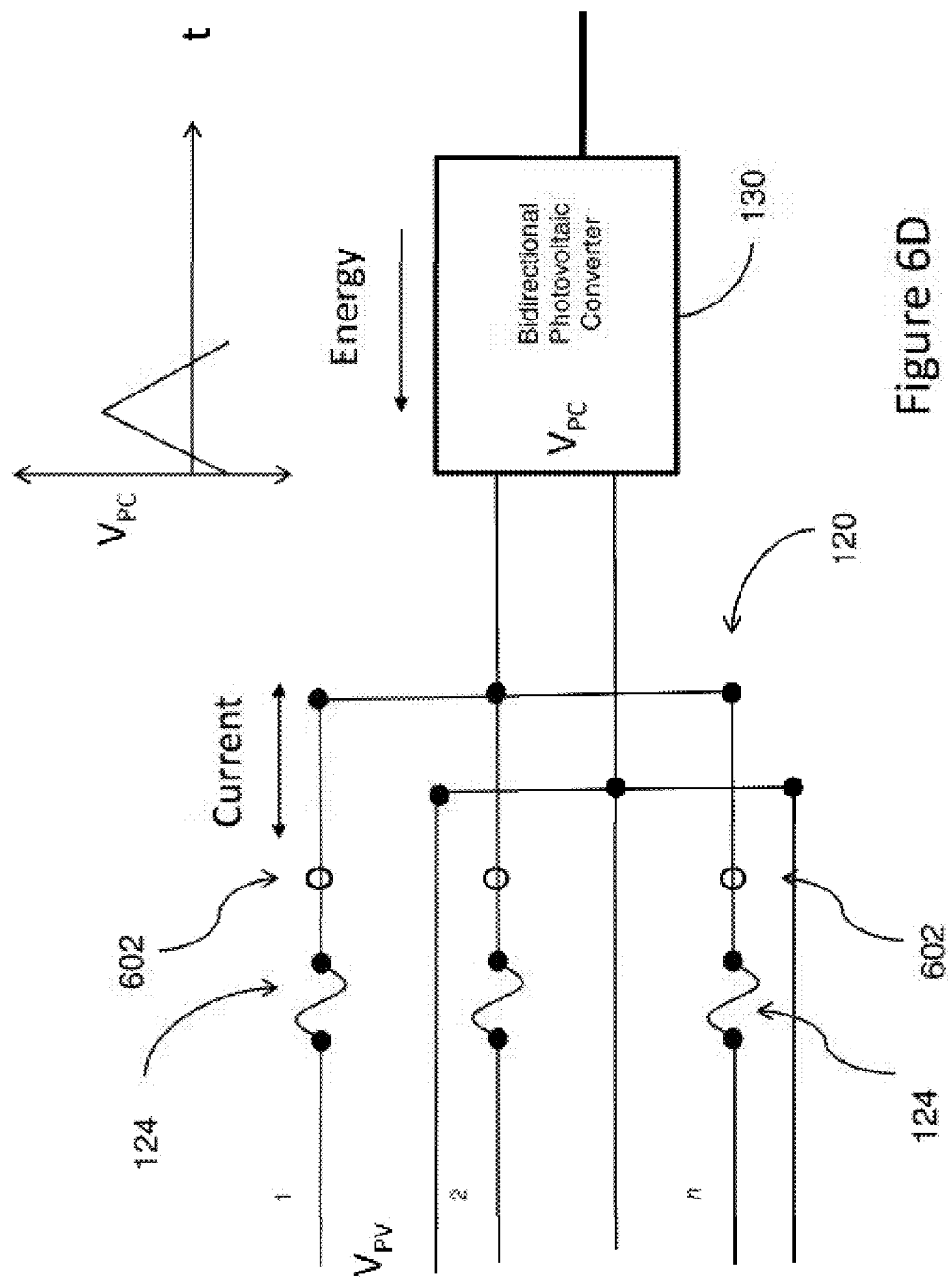

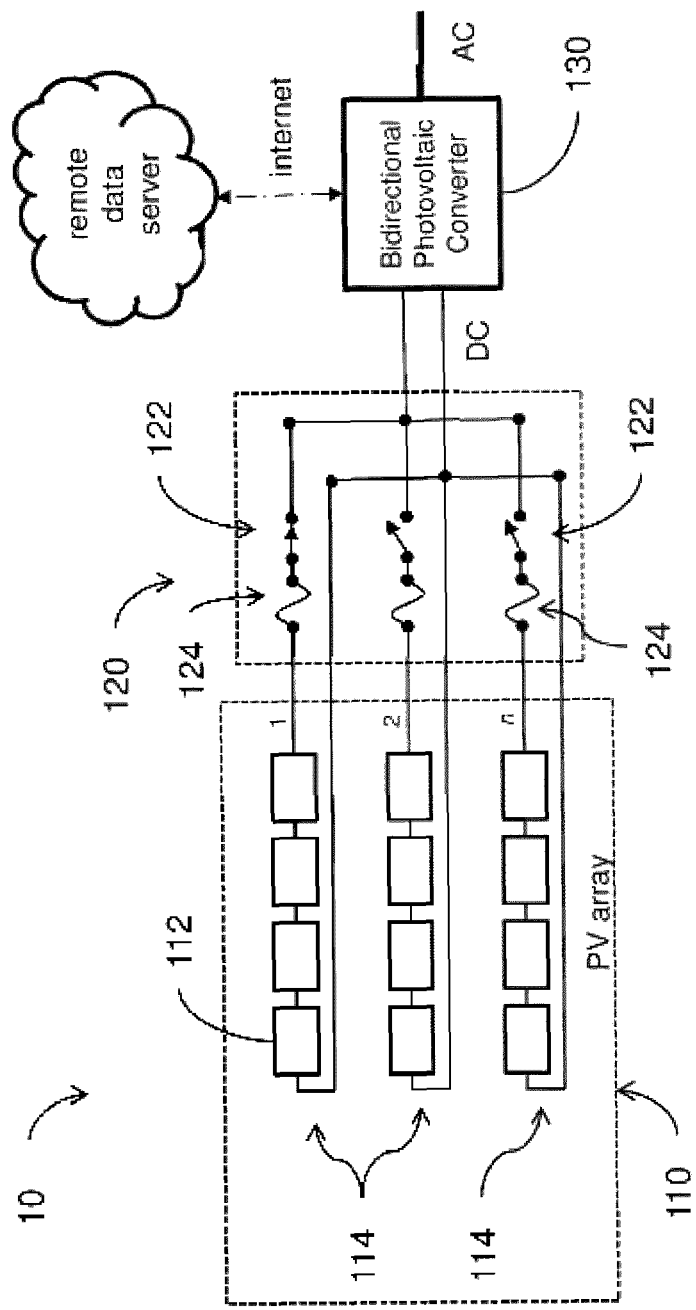
Figure 7A. Diagnostics with String Disconnects
Opens all strings disconnects except for string under test

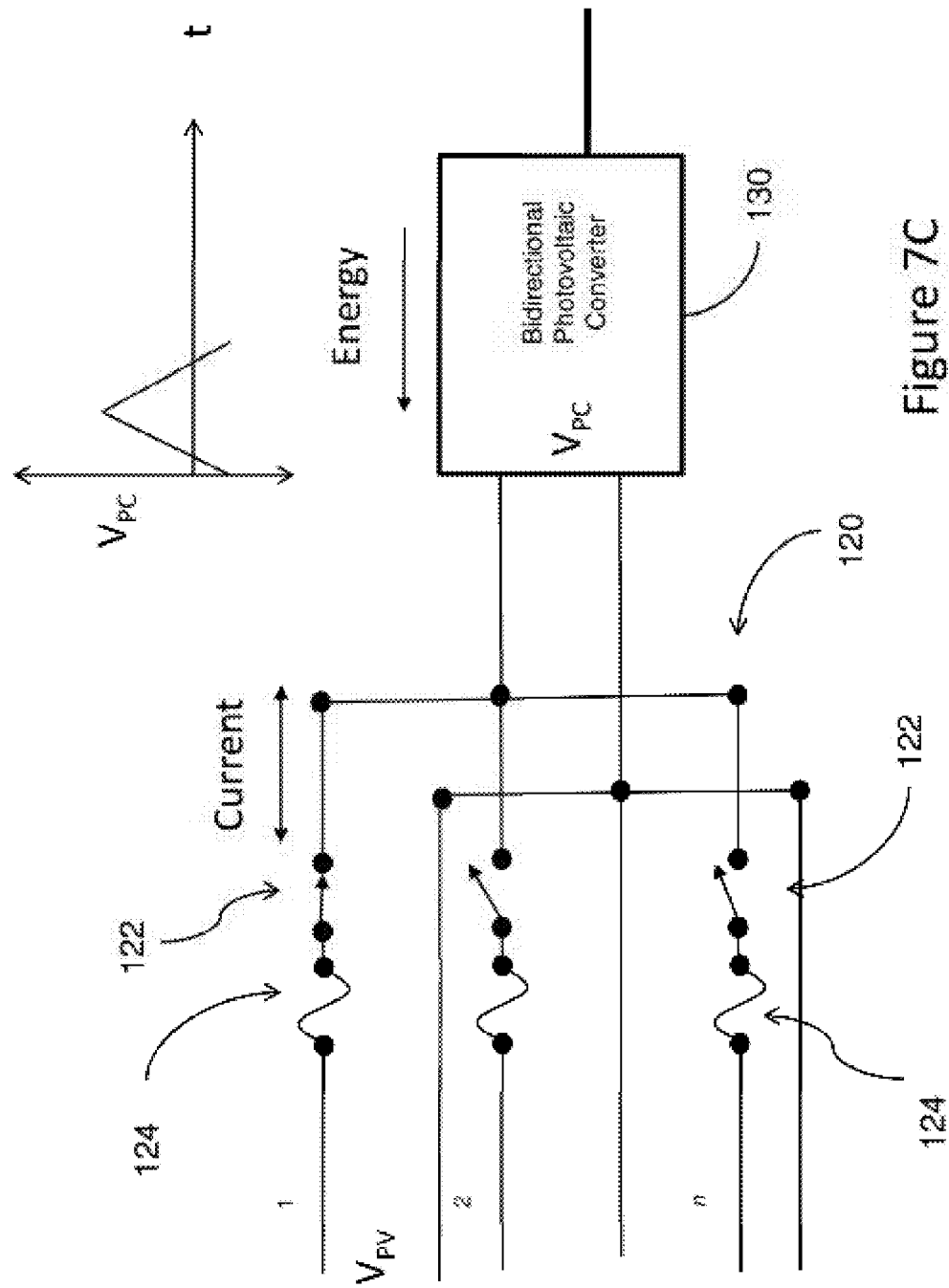

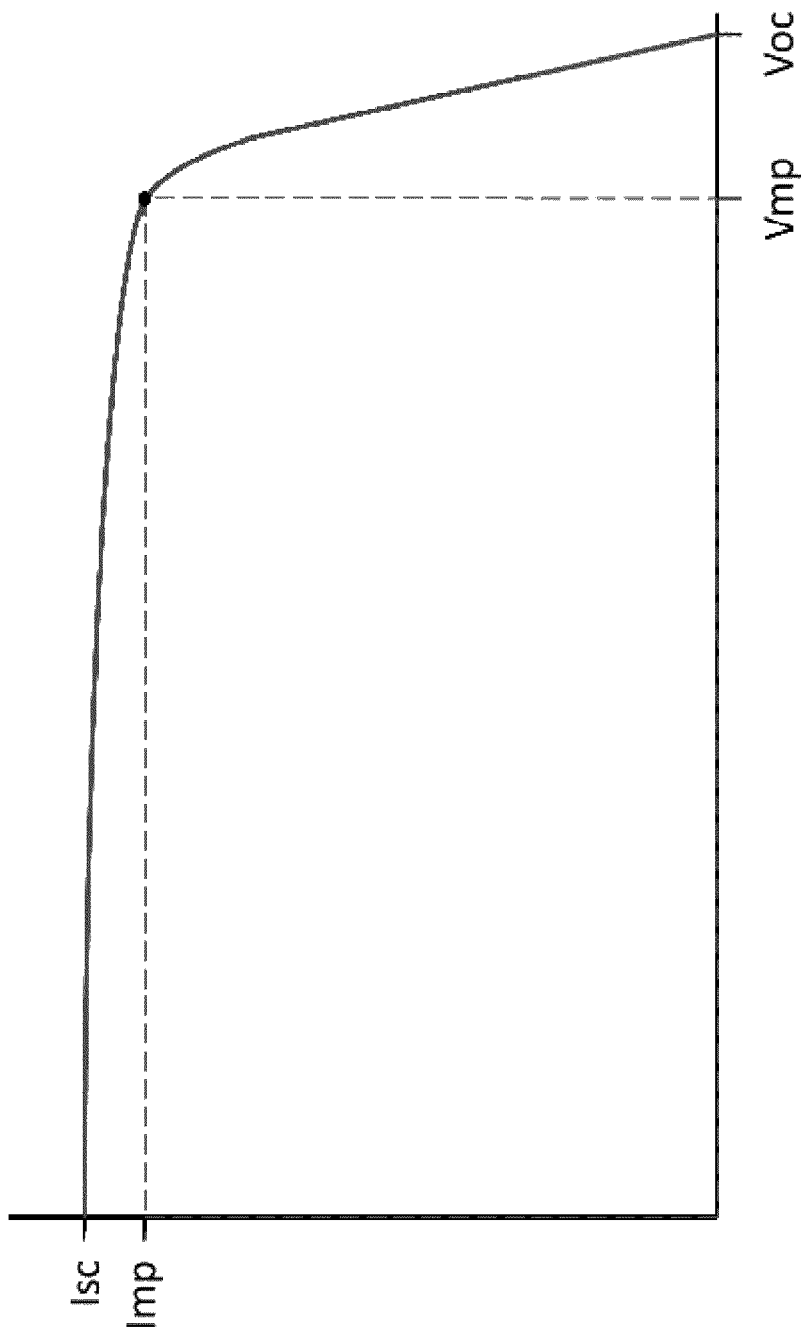
Figure 8. Normal IV Array Curve

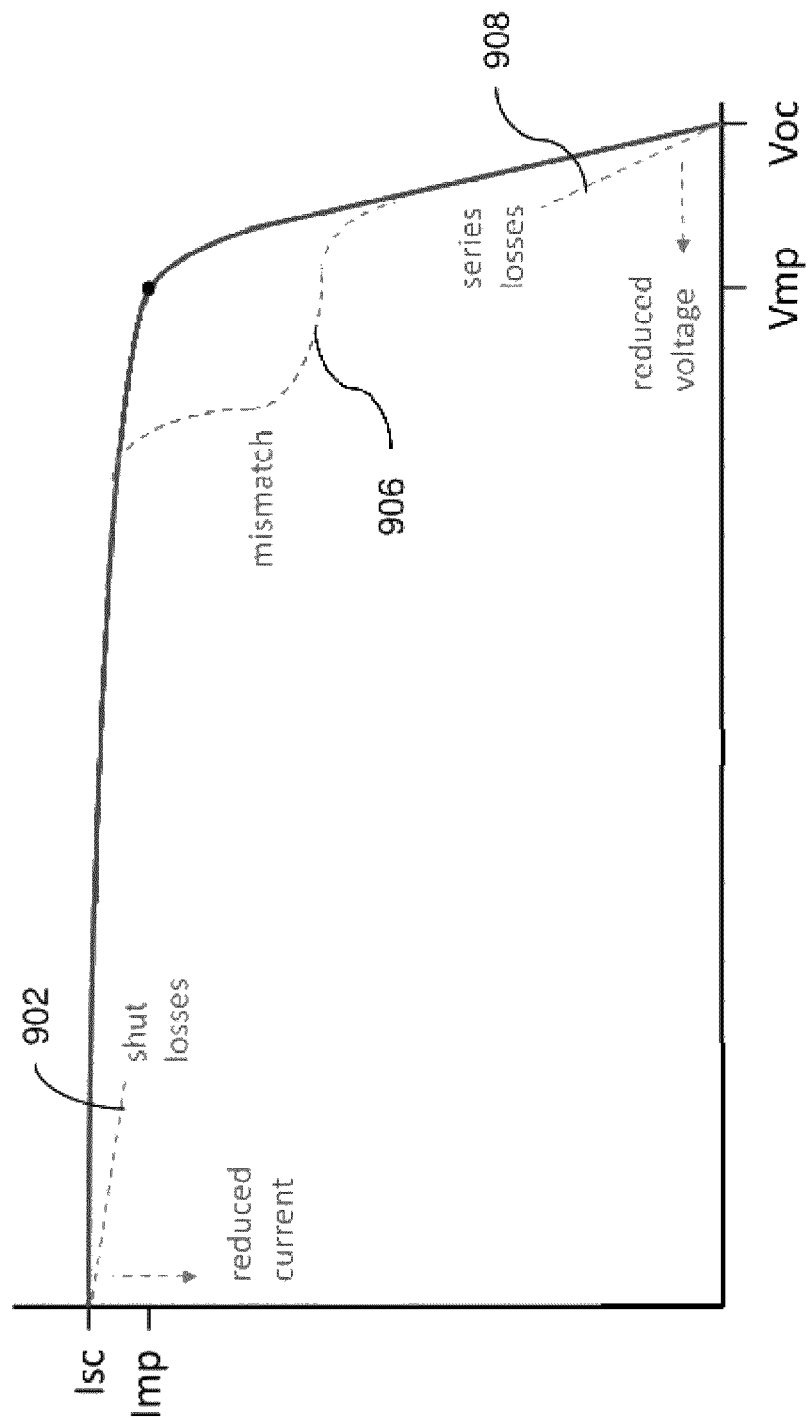
Figure 9. IV Curve Array with Impairments

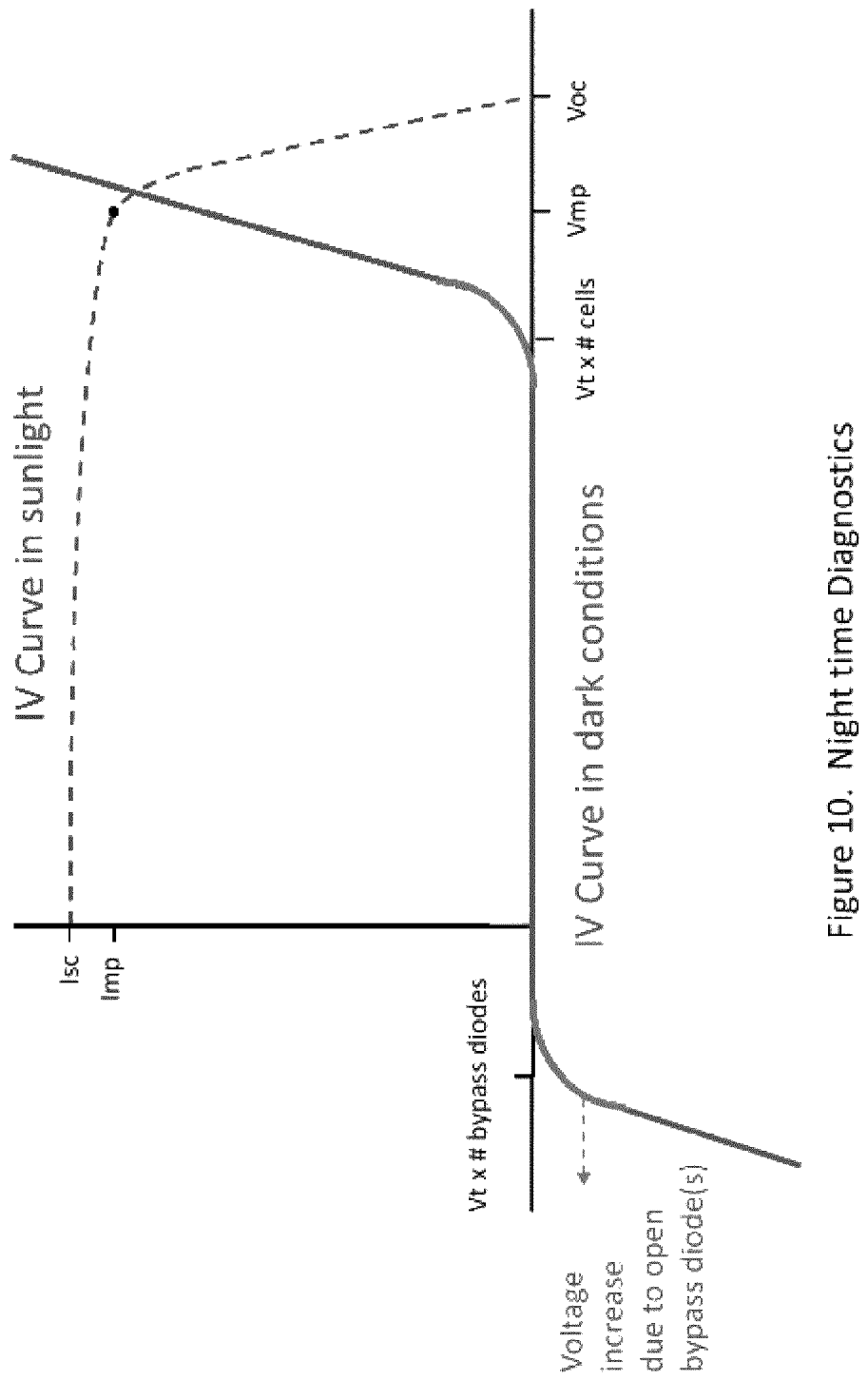
Figure 10. Night time Diagnostics

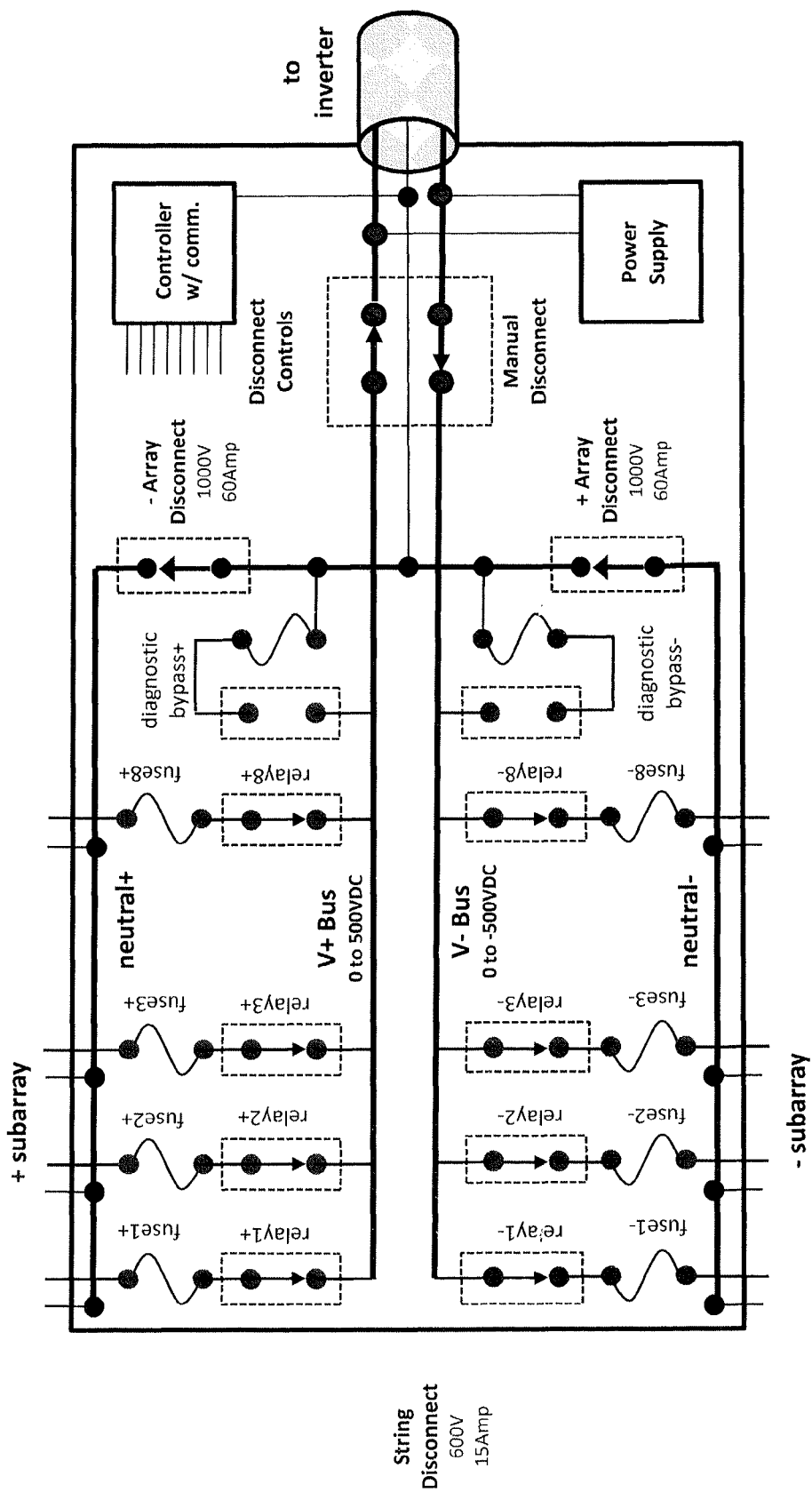
Figure 13A. All switches closed except +/- diagnostic bypass

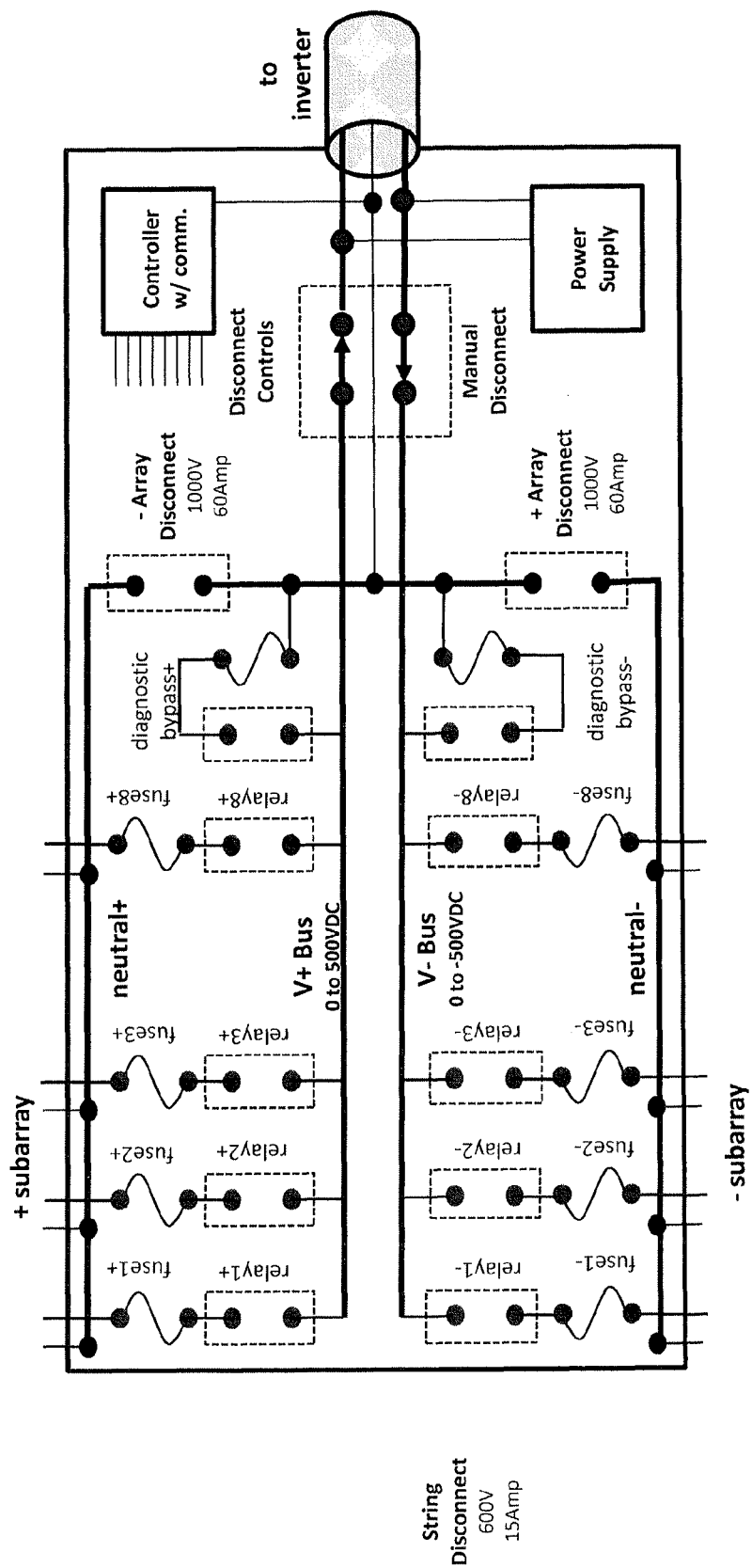
Figure 13B. All switches open. Occurs during power down, inverter/grid faults, & by command.

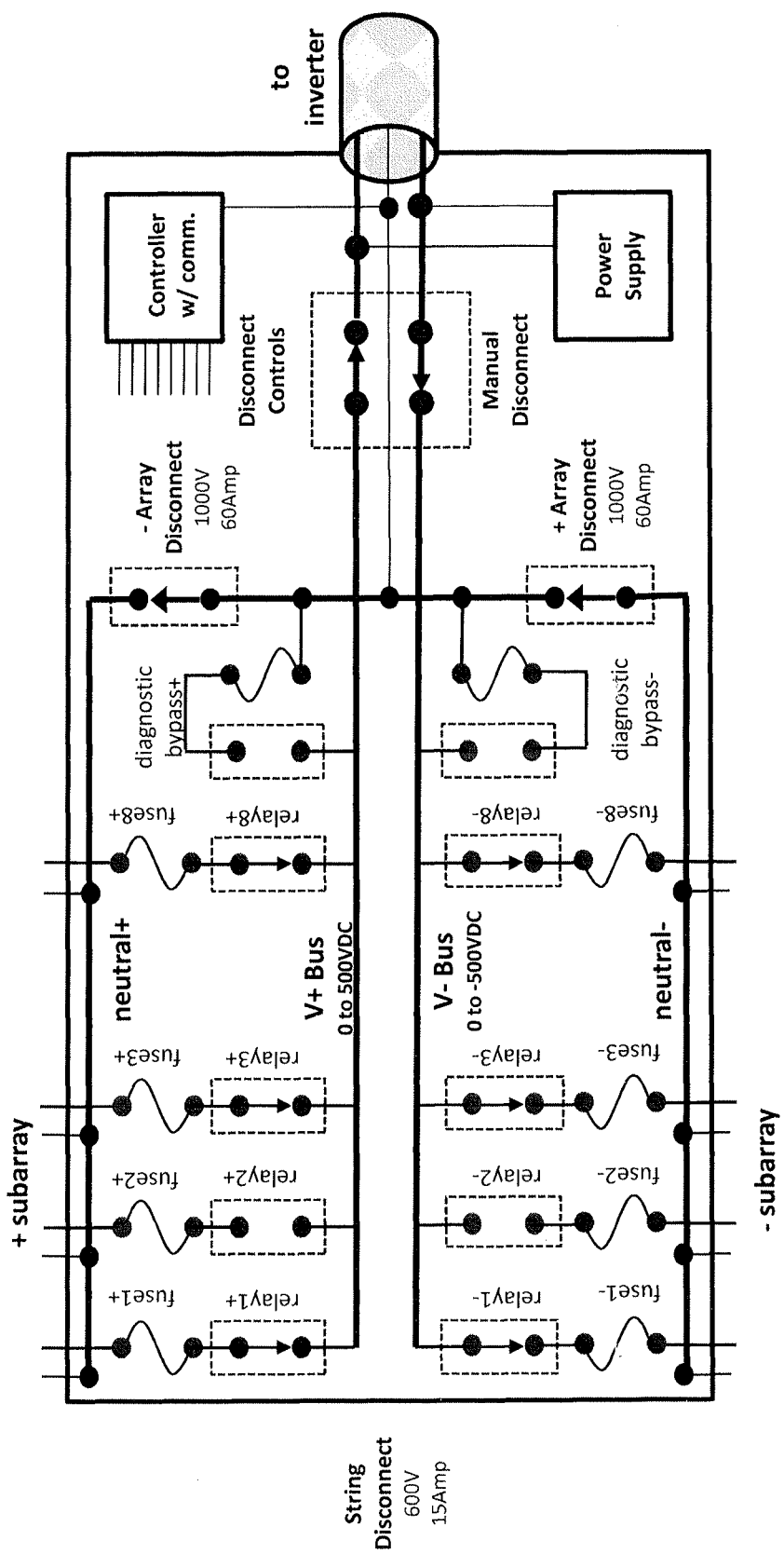
Figure 13C. One string relay pair (relay2+/-) opened, and power difference measured at inverter.

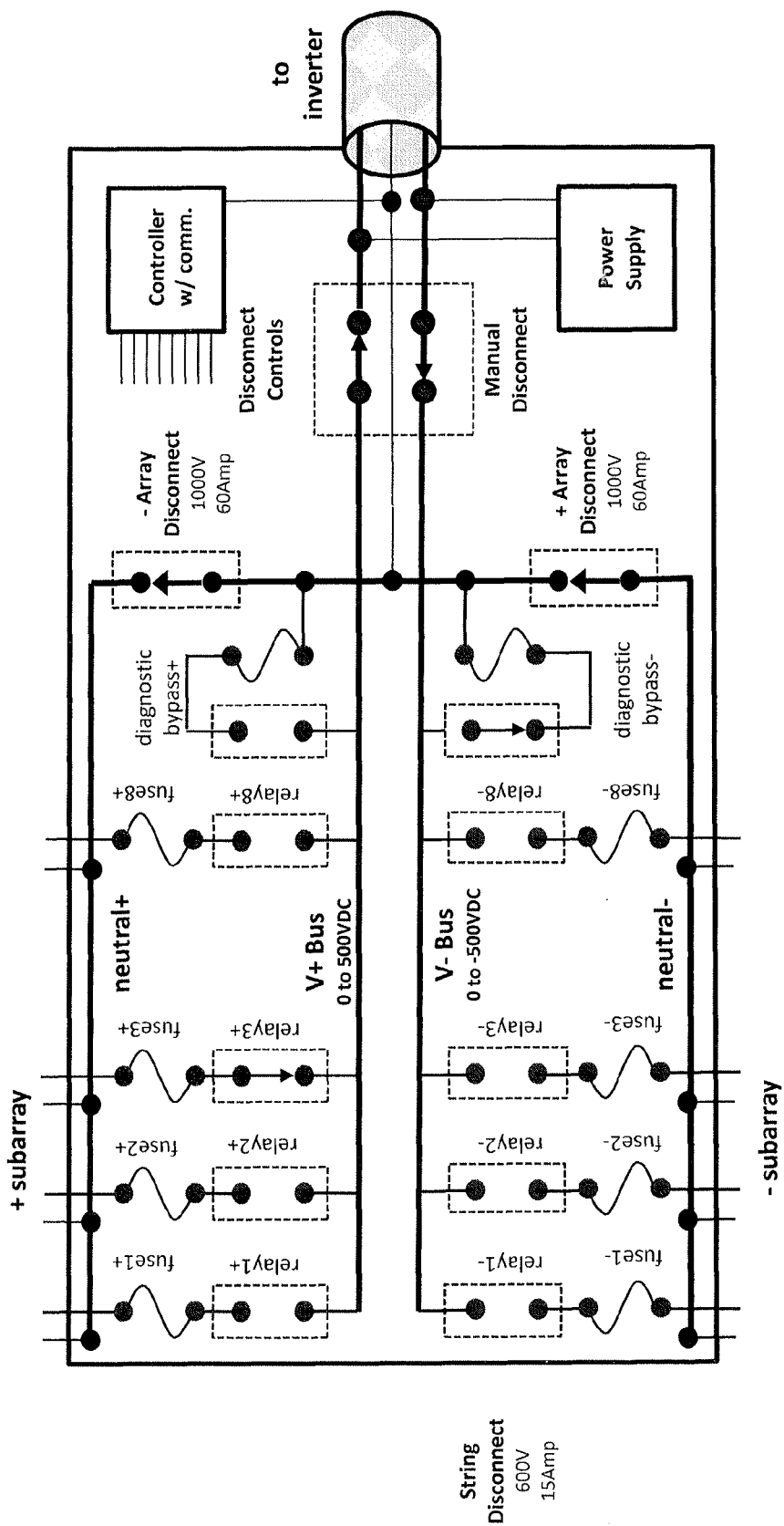
Figure 13 D. One half string closed (relay3+) and matching bypass (-). Inverter can run full sting level IV curve in situ

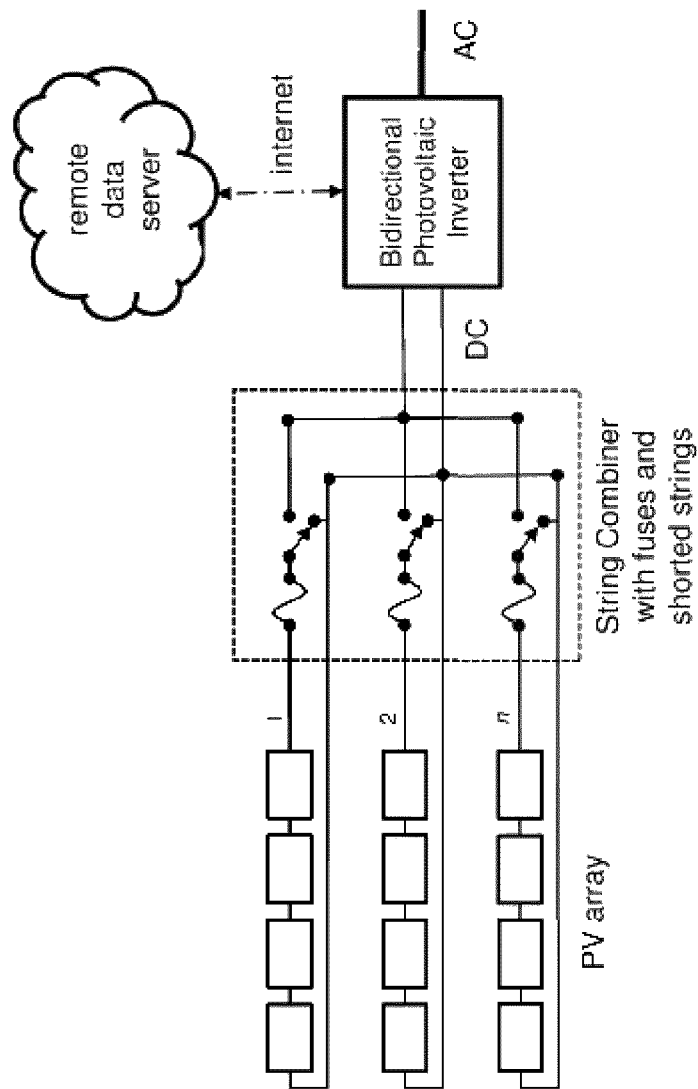
Figure 14. Safe Mode with Shorted Strings
Shorts all strings to eliminate voltage on all DC wiring

US 8,446,042 B2

PHOTOVOLTAIC ARRAY SYSTEMS, METHODS, AND DEVICES WITH IMPROVED DIAGNOSTICS AND MONITORING

CROSS-REFERENCE

Priority is claimed from U.S. Provisional Patent Applications 61/418,144, filed Nov. 30, 2010, and 61/480,048, filed Apr. 28, 2011, both of which are hereby incorporated by reference.

BACKGROUND

The present application relates to photovoltaic arrays for collecting solar energy to provide useful power, and more particularly to improved devices, systems and methods for diagnosing and monitoring such arrays.

Note that the points discussed below may reflect the hindsight gained from the disclosed inventions, and are not necessarily admitted to be prior art.

Photovoltaic systems are one of the fastest growing sources of energy and are increasingly cost-effective. The cost and reliability of photovoltaic systems and their components, including photovoltaic modules and photovoltaic converters, continue to improve.

Photovoltaic modules and components are often in service for many years. An array or its components may be warranted for more than 20 years. While modules and other components are generally reliable, problems do arise. Over their service life, components are subject to malfunctions and/or performance degradation.

Various power monitoring systems are used to determine if actual performance meets projections. These power measurements can be: AC power at the output of the converter, DC power at the input of the converter, DC power at the string level, and DC power at the individual module. Each of these monitoring systems provides certain useful data for determining if the system is operating properly. However, these power monitoring systems are less useful for diagnosing issues when performance is inadequate.

Photovoltaic modules in the laboratory or manufacturing environment are often measured to provide a current-voltage curve ("IV curve") that determines the module performance across the range of operating current and voltage points. The IV curve also varies with the amount of solar insulation and ambient temperature. IV curves provide a detailed insight to the internal performance of the photovoltaic module, which cannot be obtained easily once the system is installed in the field.

More recently, IV curve trace tools have been developed to enable photovoltaic maintenance personnel to diagnose issues in the field with installed photovoltaic systems. IV curve trace measurements can identify the cause of low performing modules such as soiling or shading, but they require highly-trained maintenance staff to use and interpret the measurements.

Published US application 2010/0071744 describes a Photovoltaic Installation with Automatic Disconnect Device. The DC disconnect device described therein uses a single DC disconnect with a control mechanism to disconnect in case of fire or other emergency. The single DC disconnect is located at the typical manual DC disconnect location between the string combiner and the converter. However, this system does not appear to offer any capability for string monitoring or diagnostics.

SUMMARY

The present application discloses novel systems, methods, and devices for a photovoltaic array with improved monitoring and diagnostic capabilities.

In some embodiments, an array comprises a bidirectional power converter capable of applying a DC potential to the array or to a portion of the array to perform monitoring and diagnostic operations. In some embodiments the bidirectional converter can bias the photovoltaic array to variable DC voltage of either polarity, and under any solar condition including day or night. These capabilities, when combined with existing DC current measurements from conventional power monitoring, can allow measurements such as an I-V curve trace to be created without additional equipment.

In some embodiments, an array comprises multiple strings of photovoltaic modules. The array is configured so that individual modules, strings or sets of strings may be selectively connected and disconnected from an converter, allowing monitoring and diagnostic operations on a module, string, or sub array level. The array can also include a safety mode with no power output.

The disclosed innovations, in various embodiments, provide one or more of at least the following advantages. However, not all of these advantages result from every one of the innovations disclosed, and this list of advantages does not limit the various claimed inventions.

Allows diagnostics during daylight and nighttime or shaded conditions;
Allows higher level diagnostic operations without additional expensive equipment;
Monitoring and diagnostics may be performed without technicians;
Provides for string or module level monitoring and diagnostics;
Provides for regular monitoring during operation without significant power loss;
Provides no output safe mode for maintenance or emergencies;
Improves array performance and efficiency;
Allows early detection of problems;
Reduces costs associated with warranty obligations of the system manufacturer or installer;
Reduces maintenance costs;
Allows for diagnostics on module, string or sub array level without separate equipment at each unit;
Allows for better visibility into the long-term life expectancy, and in-service degradation, of a solar array, and hence allows for lower implicit risk allowance in financing of solar array systems.

BRIEF DESCRIPTION OF THE DRAWINGS

The disclosed inventions will be described with reference to the accompanying drawings, which show important sample embodiments and which are incorporated in the specification hereof by reference, wherein:

FIG. 1 schematically shows an embodiment of a PV system.

FIG. 2 schematically shows possible measurement locations for a PV system.

FIG. 3 is a flow chart illustrating a procedure for monitoring power output of a PV array.

FIG. 4 shows an embodiment of a PV array with one string disconnected.

FIG. 5A is a flow chart illustrating a procedure for diagnosing problems in a PV array.

FIG. 5B is a flow chart illustrating an improved procedure for diagnosing problems in a PV array.

FIGS. 6A-6F illustrate several operating and diagnostic scenarios for a PV array.

FIGS. 7A-7C shows an embodiment of a PV array with one string connected.

FIG. 8 shows an example of an I-V curve for a properly operating PV module.

FIG. 9 shows examples of I-V curve abnormalities.

FIG. 10 shows an example of an I-V curve for a properly operating PV module at night time.

FIGS. 13A-13D show example states of an embodiment of a PV string combiner.

FIG. 14 shows a PV system with string shorting to eliminate output voltage on for safety.

DETAILED DESCRIPTION OF SAMPLE EMBODIMENTS

Figure 6B:
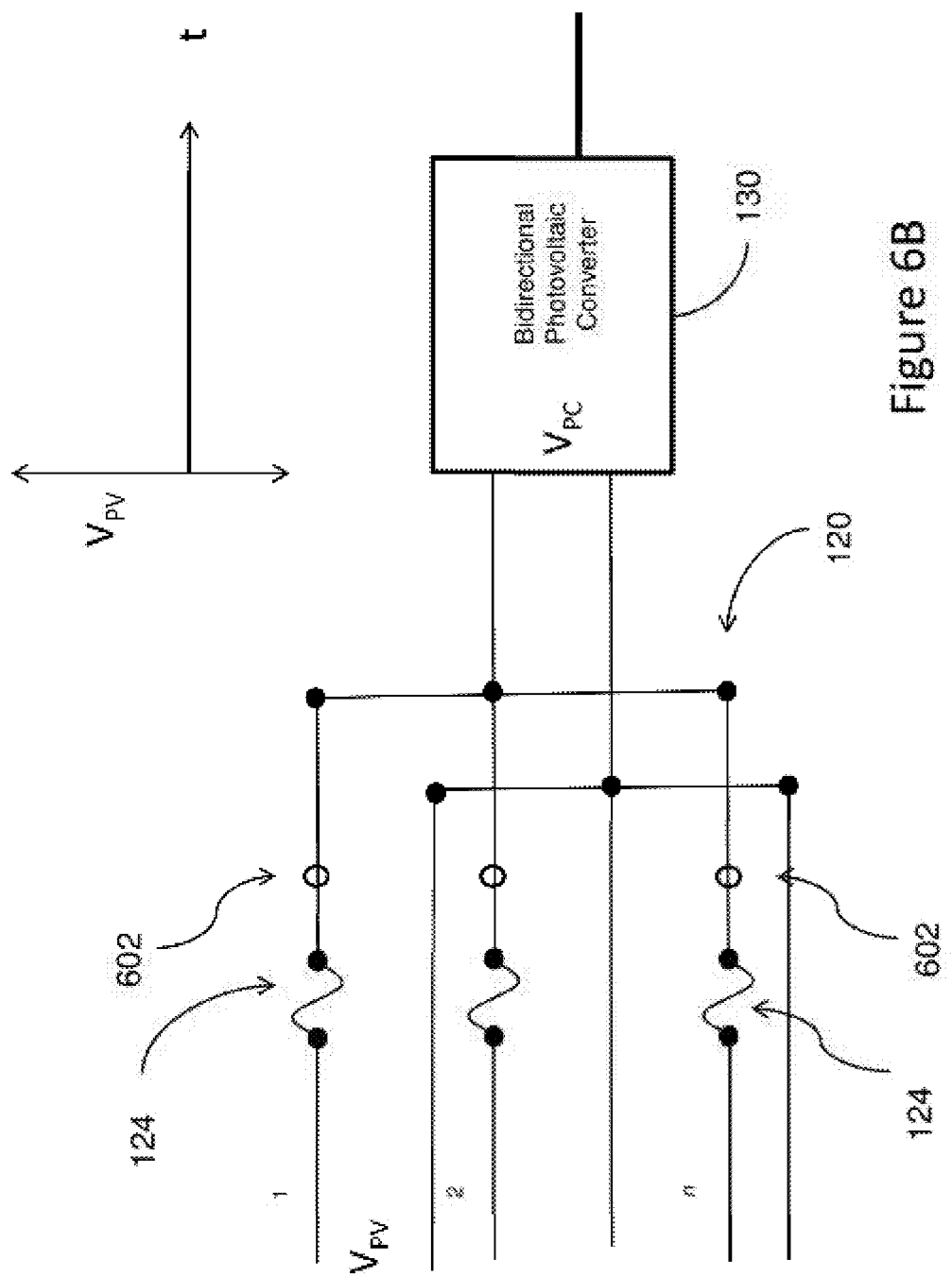

The numerous innovative teachings of the present application will be described with particular reference to presently preferred embodiments (by way of example, and not of limitation). The present application describes several inventions, and none of the statements below should be taken as limiting the claims generally.

The present application describes photovoltaic power systems with a number of new features. In the following description, it should be remembered that the various inventions can be used in other combinations or subcombinations, or separately, and do not have to be combined as described.

The disclosed inventions focus on improving system performance by enabling low-cost string-level DC monitoring and diagnostics with no reduction in peak efficiency. Improved DC monitoring and diagnostics will enable PV system owners and operators to easily identify and cost-effectively correct non-optimal array conditions.

Several of the new functions will now be described briefly, and a more detailed description follows later.

System and String DC Power Monitoring

AC power monitoring from the converter output is common in the industry, but DC power monitoring is less frequent due to higher implementation cost of measuring DC current. One group of disclosed inventions allows a single DC current and voltage power monitoring system in the converter. The converter can measure combined string DC current and voltage (continuously or with sampling). This data will be stored temporarily in the converter and downloaded to a remote internet data server.

In the preferred implementation, the DC power monitoring system will regularly disconnect individual strings and measure the change in DC current and voltage. The difference in power will be the power lost from the disconnected string. This only requires short disconnect time (approximately 1 second per string) with the rest of the system active. As result there is no significant energy loss in this procedure. This function would be performed regularly (such as once every few hours) or as desired via remote operator control.

In a sample implementation, the string power measurements are compared to power measurements from other strings from the same point in time and previous measurements from the same string to determine if the power is lower than predicted. This would be determined by the remote data server or by the converter. If the difference between predicted string power and measured string power is higher than a set point, then the system may be programmed to trigger a string alarm at the converter or by sending email or text message(s) to maintenance personnel.

Some industry products support string alarms, but with higher system costs. These systems use string level DC current meters, an expensive component, on every string. These provide continuous DC current measurements on every string, but practically these provide no more useful system information than the regularly sampled string monitoring achieved with this group of inventions.

String Diagnostics

String diagnostics would occur when a string alarm is received or during infrequent maintenance (perhaps monthly). String diagnostics can be performed on all strings simultaneously, if appropriate current sensors are provided for each string, or can be performed one string at a time using string disconnects with one current sensor at the central converter. When combined with advanced DC monitoring capabilities in the converter, a wide variety of string measurements can be taken including open circuit voltage (Voc), Short Circuit Current (Isc), and current-voltage (I-V) performance curve. Furthermore this could be implemented during both daylight and night conditions.

This data will be provided to the remote data server which can be used to determine a wide variety of string problems including shading, soiling, degrading/out of specification PV modules, and string wiring shorts/open conditions. This alerts maintenance personnel to specific problems and corrective action requirements.

String Disconnect for String Maintenance

Disconnecting the individual string can allow maintenance to work on a specific string while the remainder of the array is active. Replacing a PV module or looking for wiring shorts/opens is an example of maintenance work that can be simplified with this system.

Array Disconnect for Converter Maintenance

The system can provide DC array disconnects near the PV array while the converter may be located some distance away. By disconnecting all PV strings, the converter is disconnected from the DC power source. This can simplify converter maintenance or replacement procedures.

Array Disconnect for Safety

Fire departments normally shut off the main AC power disconnect when responding to fires to ensure the electrical lines in a building are de-energized. Since PV modules generate power whenever the sun is shining, disconnecting the main AC alone does not shut off DC power lines associated with the PV system. Many fire codes (including NEC) require DC disconnects on the roof near the PV array. The string disconnects in the preferred implementation of the disclosed inventions will have a local manual switch as well as a remote converter controlled array shutdown for safety.

PV Power Architectures with Bidirectional Power Converter

For many applications, a Photovoltaic power system will include connection to local AC load, power line, battery, photovoltaic array, and sometimes also to other local loads (e.g. DC, or multiple AC voltages). As described in published PCT application WO2008/008143, which is hereby incorporated by reference, a Universal Power Conversion architecture is useful for such applications. This architecture provides extremely versatile conversion of voltage, current, impedance, frequency, and/or phase. The present inventors have realized that this architecture opens the door to even more capabilities in PV architecture.

Figure 11:
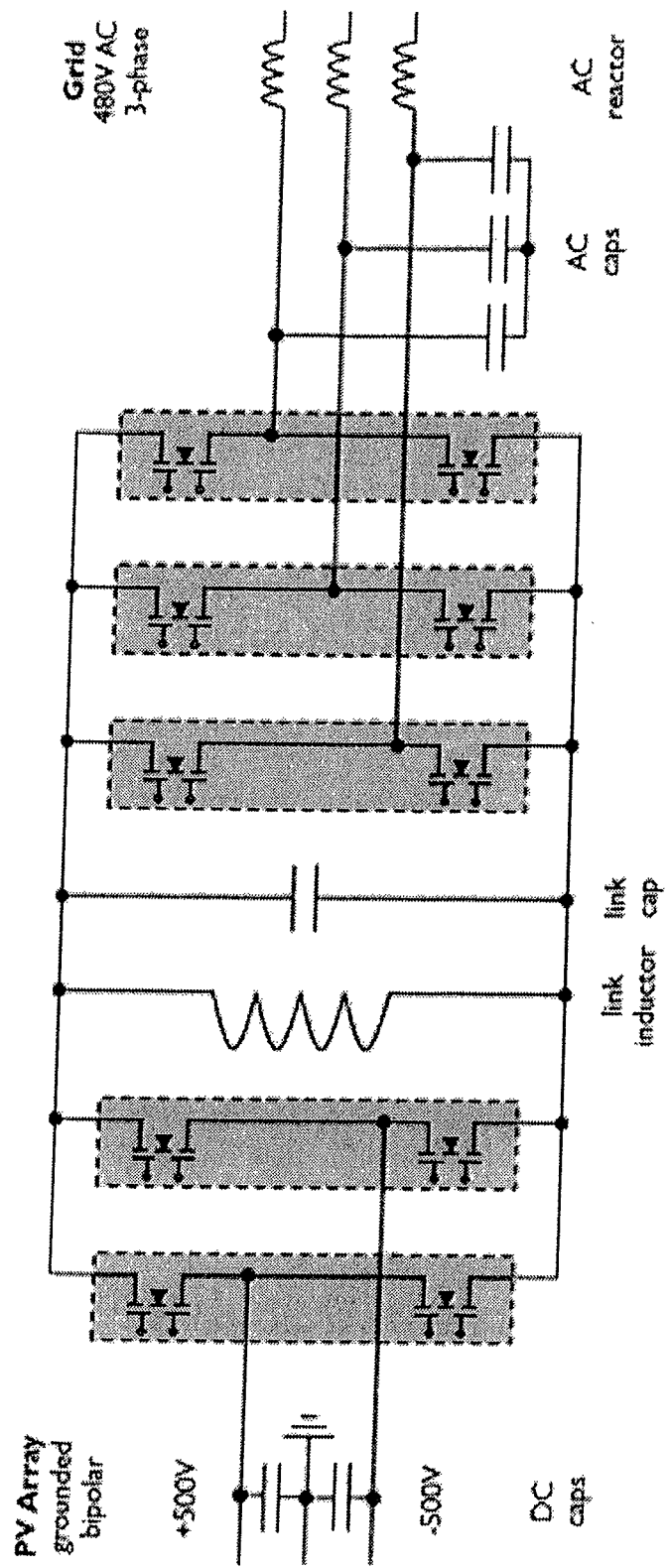
FIG. 11 shows an example of a bidirectional power converter topology which can be used with the disclosed inventions, and is especially advantageous.

FIG. 11 shows a simple example of a current-modulation PV converter topology, which can be used as the bidirectional converter in the various system implementations which will be described below. The example shown in this drawing is a bipolar array, where a common ground is used with two photovoltaic arrays which provide separate positive and negative voltage outputs. However, the same converter topology can also be used in a single-ended configuration, as shown in the examples of FIG. 1 and other drawings. This example shows conversion from a bipolar grounded array of photovoltaic cells to three-phase 480V AC power (e.g. at 60 Hz). The link reactance is an inductor-capacitor parallel combination, and is operated in a current-modulation mode. In this example, five identical phase legs are used, each of which includes two AC switches. Two phase legs are used for the DC lines to the PV array, and three are used to connect to the three phases of the AC output lines. No other power semiconductors are needed.

In addition to the active components in the phase legs the converter uses a central Link Inductor (LI) with a Link Capacitor (LC) in parallel, and input and output capacitive filters. All power transfer occurs through the LI such that input and output lines are never connected together, which is why this topology does not need a transformer to achieve common mode isolation between the solar array and the utility lines. The LC allows for zero voltage turn-off (ZVT), almost eliminating switches losses.

At full power, the link frequency is 7,000 Hz. The converter is controlled by an FPGA, which only needs line and link voltage sensing to operate. This simple example shows a minimal configuration with only two ports (line and photovoltaic array), but practical implementations would typically include more connections.

Many of the described embodiments are single-ended, where only two wires (power and ground) connect the converter to the PV array. However, this figure illustrates a center-grounded embodiment, where three wires (positive, ground, and negative) connect the converter to the PV array.

Figure 12:
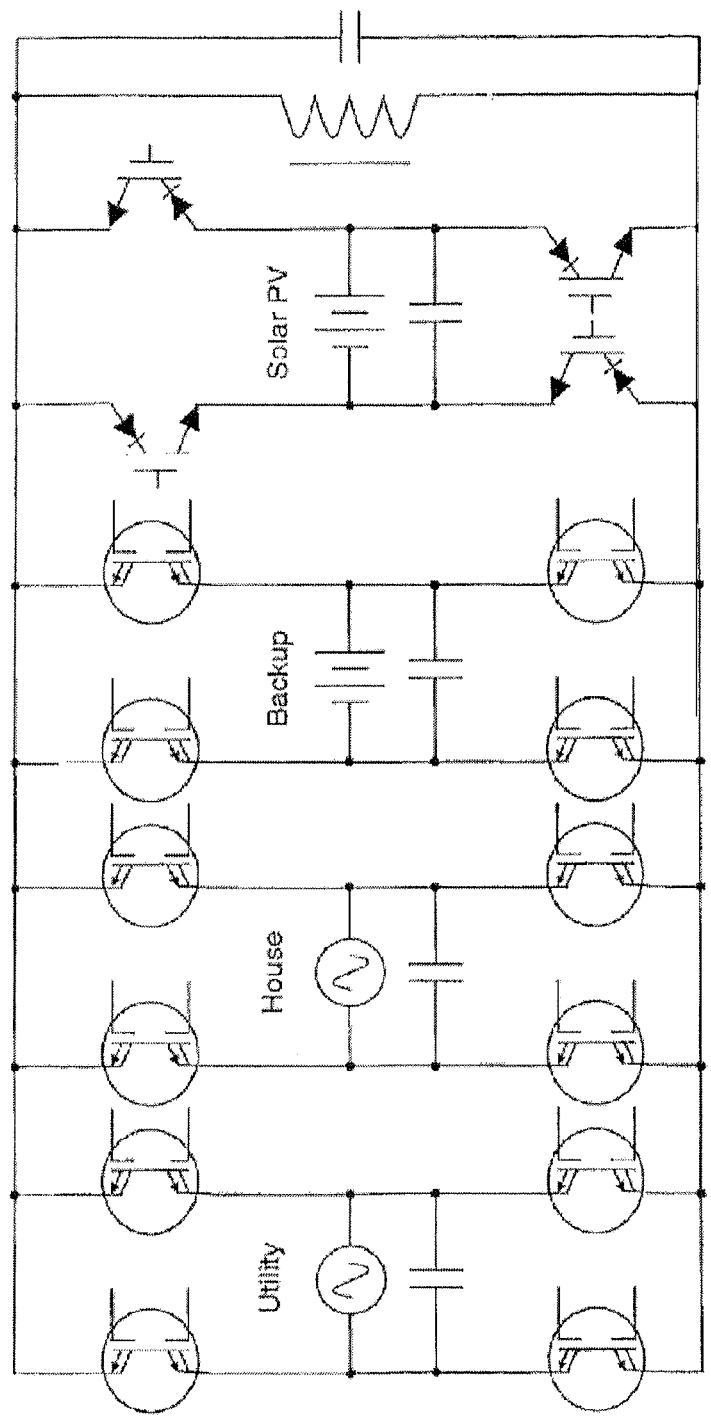
FIG. 12 shows a more comprehensive illustration of a solar power system.

FIG. 12 is a more complete example, showing how a bidirectional converter would be connected to multiple portals in a complete PV power system. In this example, four portals are provided, namely "House" (local AC load), "Utility" (power line), "Backup" (battery), and photovoltaic array. However, other portals can be added. In addition, polyphase connections can be provided instead of or in addition to the single-phase connections shown.

String Shorting

As photovoltaic array designs have migrated to higher DC voltage levels, safety has become an increasingly important concern. (Older designs might use e.g. 48V DC peak daylight voltage, but newer designs commonly stack PV modules to achieve a 600V or 1000V DC voltage, for reduced loss.) The present application provides a new approach to safety: when total shutdown is desired, two identical (or comparable) strings can be connected together with opposite senses, i.e. positive to negative (or ground) and negative (or ground) to positive. This avoids the danger of a high voltage appearing when illumination changes. This connection will cause a current loop, so preferably this connection is made between elements or subarrays which will not exceed the current rating of the switches. Alternatively, a positive terminal of a string is shorted to the negative terminal of the same string. An embodiment of a PV system in safe mode with shorted strings is shown in FIG. 14.

Apply DC Voltage to Array for Monitoring/Diagnostics

One important class of teachings uses the bidirectional converter to apply a selected DC voltage back onto the PV array. This can be used in a number of ways, as described below, to provide the system with additional capabilities.

In a system with battery backup, the converter can also be used to draw power from the backup battery to apply a back voltage onto the array. However, this is less preferred.

Method of Diagnostics by Applying Variable DC Voltage

One important class of teachings uses the bidirectional converter to apply a variable DC voltage back onto the PV array. By ramping or stepping the applied voltage, while monitoring current, IN curve characterization can be used to assess the PV array.

In a system with battery backup, the converter can also be used to draw power from the backup battery to apply a back voltage onto the array. However, this is less preferred.

Method of Diagnostics by Applying DC Reverse Voltage

Another important class of teachings uses the bidirectional converter to apply a negative DC voltage (opposite to the voltage which is generated in daylight) back onto the PV array at nighttime. The negative voltage permits the bypass diodes to be tested.

In a system with battery backup, the converter can also be used to draw power from the backup battery to apply a back voltage onto the array.

Theft Prevention

Another important class of teachings uses the bidirectional converter to apply a small DC voltage onto the PV array at nighttime, even when no diagnostic tests are being run. This permits changes in the impedance of the array to be measured, to thereby detect theft of elements or modules.

Implications for Risk Assessment and Bankability

Solar energy is an area of great interest, but the scale of solar installations is still relative small compared to other energy sources. As this industry rapidly grows and matures, there are some important issues beyond the basic scientific and engineering technologies. One of these is the financial risk of a large solar power system, when considered as a major asset.

One known issue for photovoltaic arrays is degradation over time. Sealing can degrade, leakage currents can grow worse, and the semiconductor material itself can develop increased internal leakage (and possibly even short circuits). Connections can degrade too, leading to open circuits or short circuits. The physics of these changes is fairly well understood, but these issues present some uncertain financial risk over the assets' lifetime.

For example, the initial performance of a $100 solar power kit for enthusiasts might be sufficient to justify its price, even if the unit only lasts a few years under outdoor conditions. However, if we are considering a $10M capital investment, for an array which may put out megawatts of power, more careful analysis is needed. For such an investment to be practical, it needs to be "bankable," i.e. predictable enough (in its future contribution to revenue) to support financing. PV module vendors provide warranties for maximum degradation, but it is difficult to measure module or array degradation accurately once the system is installed. To the extent that long-term degradation is not accurately measurable in the installation, there is an additional risk from investors, If the degradation can be accurately and easily measured, the financial risk is reduced and so will the interest cost of financing.

The disclosed inventions have a major impact on this uncertainty, since degradation can be monitored accurately and easily in-service. Thus a photovoltaic power system with monitoring capabilities as described herein will not only have a predicted initial lifetime, but that lifetime will become less uncertain as time goes by: not only will the in-service monitoring show where individual components are, within their lifetimes, but results from similar but older arrays will give an increasingly accurate picture of expected lifetime and maintenance cost.

FIG. 1 schematically shows a photovoltaic (PV) system 10 for collection of solar energy. PV system 10 generally comprises a PV array 110, a string combiner 120, and a converter 130. PV array 110 preferably comprises a plurality of photovoltaic modules 112. A PV module is typically a generally planar device comprising a plurality of PV cells.

Several PV modules 112 are combined in series to form strings 114. String 114 preferably comprises between 8 and 15 PV modules 112. However, the number of PV modules 112 in a string 114 can vary depending on the output voltage of each PV module 112 and the desired maximum DC operating voltage of PV system 10. Common maximum DC operating voltages are 600V DC and 1000V DC. Strings 114 are preferably combined in parallel at string combiner 120.

String combiner 120 preferably includes a switch 122 for each string 114 in PV array 110. Switch 122 is configured to selectively connect or disconnect string 114 from PV array 110. Each switch 122 is separably operable, so that one or more switch 122 can be opened (disconnecting one or more string 114 from PV array 110) while other switches 122 remain closed (other strings 114 remain connected). Most preferably, switch 122 is controllable by a machine or user at a remote location. String combiner 120 also preferably comprises a fuse 124 for each string 114. While switches 122 are useful for practicing certain embodiments of disclosed inventions, switches 122 are unnecessary for several innovations disclosed herein.

Under normal operating conditions, DC power from string combiner 120 is fed into PV converter 130. PV converter 130 converts the DC power to AC power, which can be used onsite or distributed over an AC distribution system. PV converter 130 is preferably a bidirectional PV converter, such as the PV converter described in WO2008/008143. PV converter 130 can alternatively be operated in reverse, so that PV converter 130 draws power from an AC power distribution system, converts the AC power to DC, and delivers a DC potential to PV array 12. PV converter 130 is preferably configured to be able to provide either a forward potential—that is, a DC voltage tending to induce current in the normal direction of current flow of the PV modules, or a reverse potential, tending to induce a current in the opposite direction of normal current through the PV modules or tending to retard the flow of current in the normal operating direction.

FIG. 2 illustrates potential measurement locations for a PV system. Measurements preferably include at least voltage and current. Position A represents array-level measurements taken at the PV converter on the AC side. Position B represents array-level measurements taken at the PV converter on the DC side. Position C represents string-level measurements. Position D represents module-level measurements.

Certain aspects of the disclosed invention can be performed using measurements taken at any of locations A, B, C, or D. Other disclosed inventions are preferably combined with measurements at particular locations. In some embodiments, measurement of one parameter, such as current, can be taken at one location while measurement of other parameters, such as voltage, can be taken at other locations.

FIG. 3 is a flow chart showing one process for monitoring PV array 110. In step 302, real-time power output data from PV array 110, or a portion of a PV array, is measured. In step 304, real-time weather data is determined. In step 306, the measured real-time power output is compared to historical power output data for similar weather conditions. If the power output is within a predicted range, then PV array 110 continues to operate normally. If the power output is not within the predicted range, then, in step 308, an alert condition is initiated.

Referring again to step 302, the real-time power output data measured for use in comparison step 306 can be data for the array, a string, or a module. Power output data for the array is preferably measured at locations A or B of FIG. 2. Power output data for a string is preferably measured at location C. Power output data for a module is preferably measured at location D.

Alternatively, power output data for a string can be indirectly measured at locations A or B if the PV system is equipped with automatic switches 122. In that case, one string is preferable disconnected using automatic switch 122, while other strings continue to provide power, as illustrated in FIG. 4. Power output data from the connected strings is compared to historical power output data from the connected string and/or historical or recent power output data for the entire array. If the power output from the connected strings is within a predicted range, the disconnected string is automatically reconnected and the next string is tested. If the power output from the connected strings is outside of a predicted range, an alert condition is initiated. Testing strings using the method described in this paragraph allows for string-level monitoring of a PV array without requiring expensive monitoring equipment for each string.

The response to an alert condition depends on the capabilities of the PV system. FIG. 5A illustrates a procedure for use in a PV system without automatic diagnostic capabilities. In step 502, maintenance personnel are dispatched to the PV system location. In step 504, maintenance personnel perform on-site diagnostics procedures as necessary to determine the problem. In step 506, maintenance personnel correct the problem.

Disadvantages of the procedure shown in FIG. 5B are that maintenance personnel responding to the alert will have limited information about the problem before arriving on site. Rather, maintenance personnel will need to perform on-side diagnostics, which takes additional time and cost. The requirement of on-site diagnostics also means more experienced and qualified staff must respond to the alert, even though the problem may be relatively simple to fix. Additionally, the lack of information increases the likelihood that maintenance will not have the necessary equipment to fix the problem and that a second visit will be required. These issues increase maintenance costs.

FIG. 5B illustrates a procedure for use in a PV system with automatic diagnostic capabilities. In step 552, after an alert condition is initiated, diagnostic procedures are performed automatically by the PV system or by a remote server or operator. Certain useful diagnostics procedures are discussed elsewhere herein. In step 554, results of the diagnostics procedures are preferably transmitted to a remote server or operator. In step 556, the remote server or operator determines an appropriate responsive action. In step 558, a maintenance visit is scheduled. In step 562 maintenance personnel correct the problem. The procedure illustrated in FIG. 5B can greatly reduce maintenance costs because information about the problem and potential causes will be available before an on-site visit. This information increases the likelihood that the right personnel and equipment are dispatched. The additional information can also be utilized by maintenance to better understand the severity of the problem. In some case it may be more financially attractive to delay dispatching maintenance and combine the site visit with normally schedule maintenance.

In the event an alert condition is initiated or detailed diagnostics is desired for other reasons, certain inventions disclosed herein provide systems and methods for such diagnostics.

In one class of embodiments, PV converter 130 provides a DC potential to the connected strings. PV converter 130 is preferably configured to provide a variable positive or negative back-converted DC potential to connected strings using power from an AC distribution system. FIGS. 6A-6G illustrate a number of potential operating and diagnostic scenarios.

FIG. 6A shows a PV array under sunlight conditions with a DC voltage Vpv being generated by PV strings. Current is conducted in the normal direction. Current is preferably measured, in this example, using a DC current meter 602 at each string. Energy is transferred through PV converter 130 to the AC distribution system. A graph of voltage versus time for this condition is also shown. Some random variation may be present, due to variation in cloud cover etc.

FIG. 6B shows a PV array under nighttime conditions with no back-converted DC voltage applied. With negligible Vpv and Vpc, no current is conducted in the system, and no energy transfer occurs.

Figure 6C:
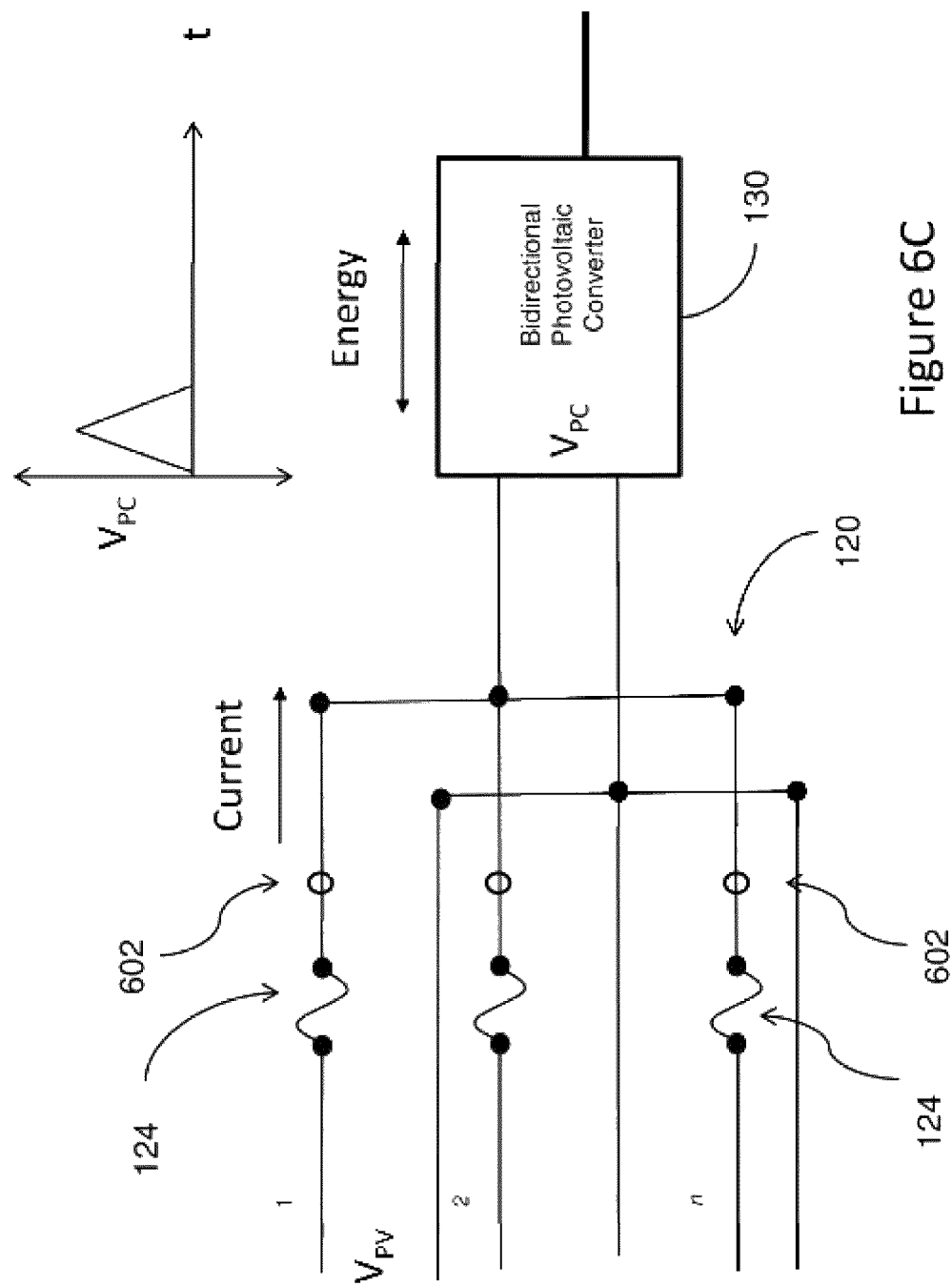

FIG. 6C shows a variable back-converted DC voltage (from Vpc=0 to Vpc>Voc) applied in daylight.

FIG. 6D shows a variable back-converted DC voltage applied at nighttime in the negative and positive directions. Again Vpv is negligible.

Figure 6E:
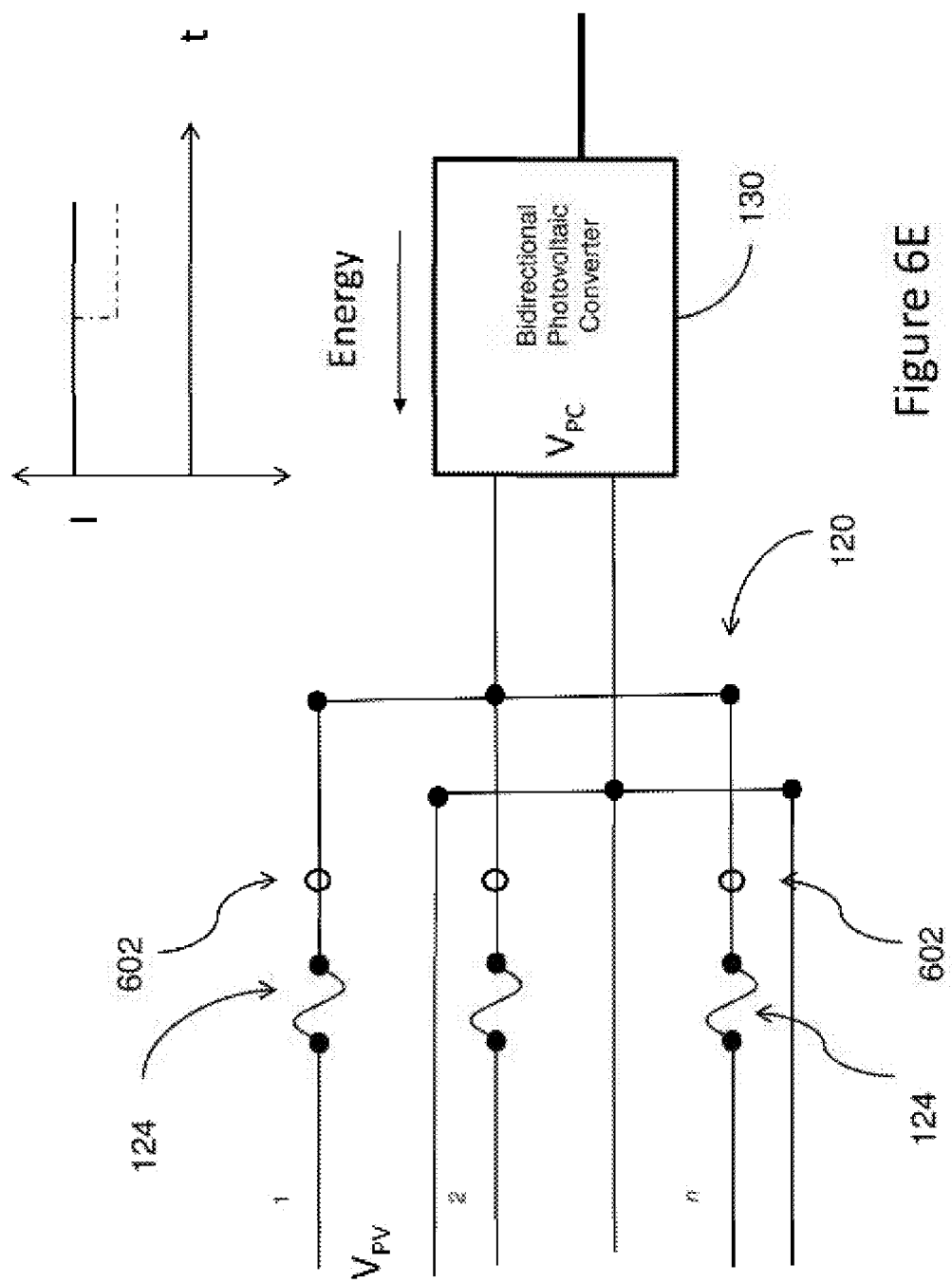

FIG. 6E shows a small constant back-converted DC voltage (e.g. 24V) applied at nighttime in the forward direction through all strings for theft-detection purposes. The accompanying graph shows current versus time. A change in current as shown by the dotted line potentially indicates tampering; for example, if one string is removed by thieves, the leakage current contribution that string will disappear. Net energy transfer is from the converter into the array, but is typically very small.

Figure 6F:
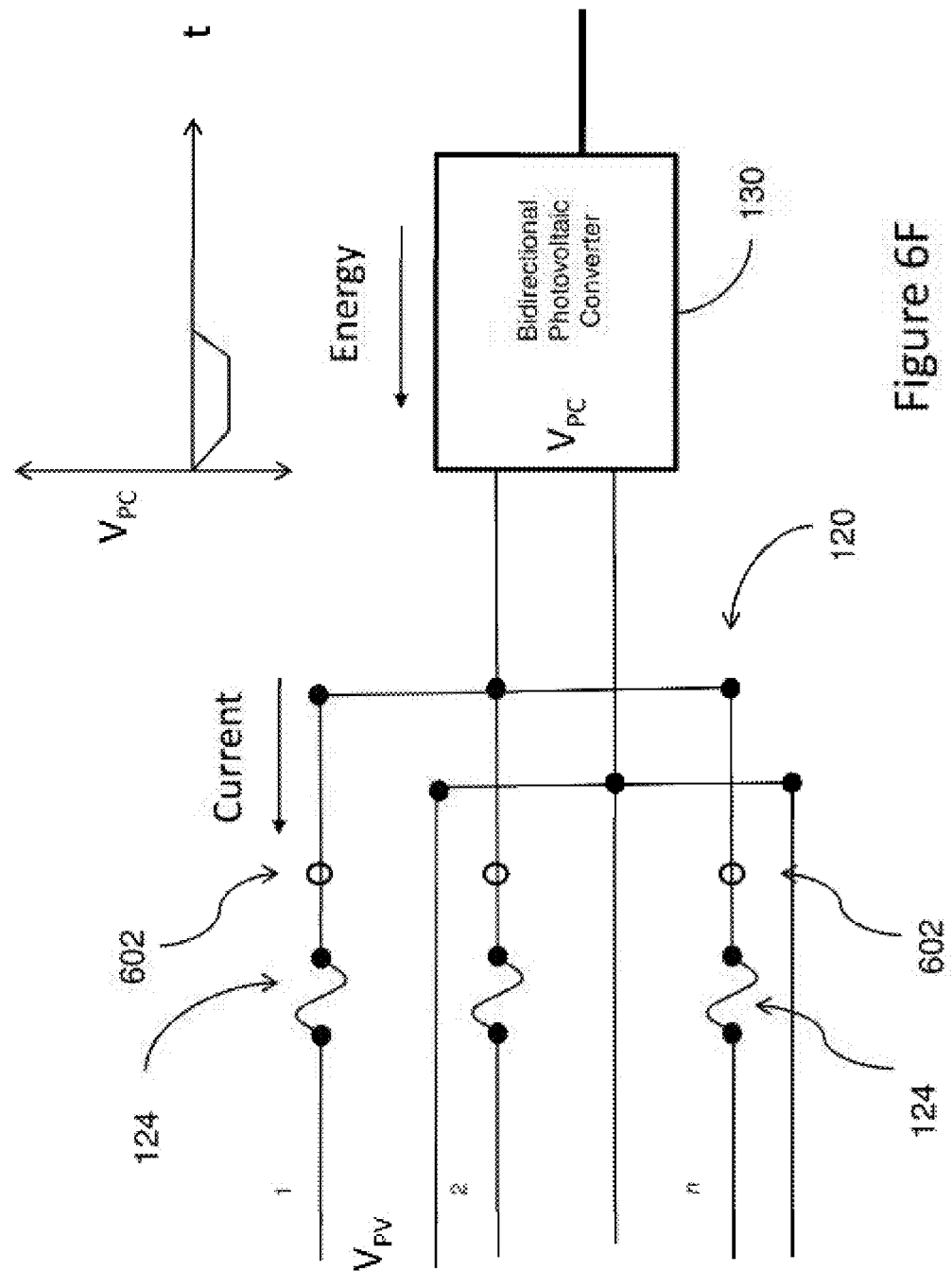

FIG. 6F shows a negative back-converted DC voltage applied at nighttime to test bypass diodes.

Figure 7B:
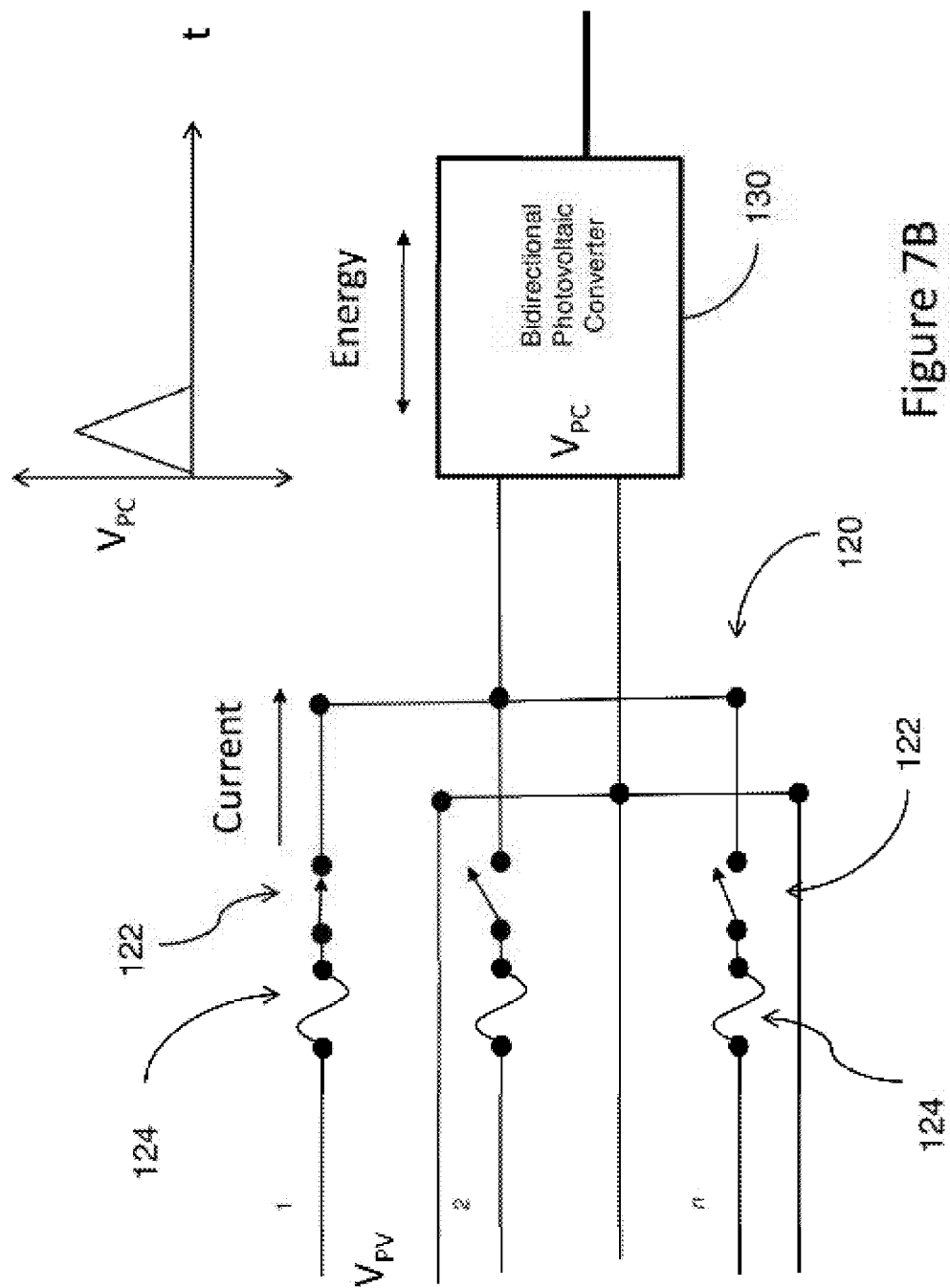

Alternatively, to measuring current using DC current meters 602 on each PV string, string-level diagnostics can be performed using switches 122. In this case, all switches 122 are open with the exception of the switch associated with the string being analyzed, as illustrated in FIG. 7A. Diagnostic functions can then be performed such as the examples shown in FIG. 7B (daytime I-V curve trace of string 1) and FIG. 7C (daytime I-V curve trace of string 1).

FIGS. 13A, 13B, 13C and 13D illustrate another embodiment of a PV string combiner in several states of operation. The string combiner illustrated in FIGS. 13A-13D divides the strings (not shown) into positive and negative subarrays. For purposes of string-differentiation power monitoring, as discussed above in connection with FIG. 4, a string pair (consisting of one positive and one negative string) is preferably disconnected in this embodiment, as shown in FIG. 13C. For purposes of individual string diagnostics, as discussed in connection with FIG. 7, only one-half of a string pair is preferably connected, as shown in FIG. 13D.

For diagnostic purposes, measurements of current through the string are taken at multiple voltages, as shown in FIGS. 6C and 6D. Preferably, current measurements are taken at a sufficient number of voltages to create an I-V curve trace. An I-V curve trace can provide valuable information about the functioning of a PV string.

FIG. 8 shows an example of an I-V curve trace of a PV string taken during daytime with significant insolation. At V0, the PV converter is not providing any load on the PV string and the current through PV string is at the maximum current, also called the short-circuit current (Isc). For a normally-operating string, as the applied voltage increases, the current through the string decreases. At lower applied voltages, the current is not sensitive to changes in voltage and the current decreases gradually from Isc, giving a shallow slope. At higher voltages, the current decreases rapidly as the applied voltage increases, providing a steep slope. Around the transition point is a maximum power voltage (Vmp), which is located at the point on the I-V curve where I*V is greatest. As the voltage increases beyond Vmp to its maximum (open-circuit) value Voc, the current falls rapidly to zero.

FIG. 9 is an I-V curve illustrating a number of problems that can be identified using I-V curve analysis. Solid line 902 shows an I-V curve for a normally-operating string. The dashed lines illustrate portions of hypothetical IV curves corresponding to string malfunctions. Line 904 has a steeper slope near V0, potentially indicating shunt losses. Shunt losses can be caused by malfunctions such as a resistive path within a cell, possibly caused by cracks or other physical damage to a cell or module.

Line 906 shows a notch in the I-V curve near Vmp, potentially indicating a mismatch error in the string. A mismatch error can be caused by shading, uneven soiling, mismatched modules, or shorted bypass diodes.

Line 908 shows a curve with an unexpectedly shallow slope near $V_{OC}$. This can indicate series losses. Series losses can be caused by problems such as a corroded connector.

Other features of I-V curves that can reveal potential problems are reduced $I_{SC}$ and reduced $V_{OC}$. Reduced $I_{SC}$ can indicate uniform soiling or module degradation. Reduced $V_{OC}$ can indicate a high module temperature, potentially caused by poor air circulation.

FIG. 10 shows an example of an I-V curve trace (solid line) taken at nighttime, when the PV modules are producing zero or negligible power. The curve shown in FIG. 6 is preferably created by applying a variable voltage using PV converter 130. The applied voltages preferably range from a negative voltage (i.e. a potential applied in the direction opposing the normal direction of current in the array) below a $V_t$ times the number bypass diodes to a positive voltage above $V_t$ times the number of PV cells being traced. Under normal conditions, a negative current will be measured at applied voltages below $V_t$ times the number of bypass diodes. A positive current will be measured at applied voltages above $V_t$ times the number of PV cells. Between these two points the current through the string will be negligible.

Examples of dark-condition curve traces that can indicate potential problems through a shift in these points. This can indicate an open bypass diode, which is a leading cause of arc faults in PV systems.

Alternatively to constructing an I-V curve trace, the system can take current measurements at key voltages associated with the PV string. For example, if $V_{mp}$ is known for a particular string, the system can measure current through the string at $V_{mp}$, and the $V_{mp}$ current can provide useful diagnostic information.

Another use for the system is to provide highly accurate performance measurements. This can be useful for initial system commission and annual performance reviews. The highly accurate performance measurements can be usefully in monitoring long term panel degradation. Currently PV systems have relatively high interest charges, in part due to the financial risk in PV array degradation. By providing highly accurate PV array degradation measurements this system may reduce financial risk and interest costs.

According to some but not necessarily all disclosed inventive embodiments, there is provided: A method of operating a photovoltaic power system, comprising: during normal operation, providing power from a plurality of photovoltaic cells to a power converter; automatically, at some but not all times during normal operation, electrically disconnecting some, but less than all, of said cells from a power converter, and performing at least one diagnostic test; and automatically electrically reconnecting the one or more strings.

According to some but not necessarily all disclosed inventive embodiments, there is provided: A method of monitoring a photovoltaic array with a plurality of strings of photovoltaic cells comprising the following steps: automatically electrically disconnecting one or more strings of photovoltaic cells from a photovoltaic array; performing a diagnostic test on the strings remaining connected; initiating an alert condition if results of the diagnostic test are outside of an expected range; and automatically electrically reconnecting the one or more strings.

According to some but not necessarily all disclosed inventive embodiments, there is provided: A method of monitoring a photovoltaic array with a plurality of strings of photovoltaic cells comprising the following steps: automatically electrically disconnecting at least one string from said combined set of strings to produce a modified set of strings; measuring electrical output characteristics of said modified set of strings; comparing said electrical output characteristics to a baseline value, to thereby ascertain the result of said disconnecting operation; and transmitting an alert if said comparing step shows that the electrical output characteristics found by said comparing step are outside of an expected range; and automatically electrically reconnecting said at least one string.

According to some but not necessarily all disclosed inventive embodiments, there is provided: A method of monitoring a photovoltaic array with a plurality of strings of photovoltaic cells comprising the following steps: automatically electrically disconnecting one or more strings of photovoltaic cells from a photovoltaic array; performing a diagnostic test on the strings remaining connected; initiating an alert condition if results of the diagnostic test are outside of an expected range; and automatically electrically reconnecting the one or more strings.

According to some but not necessarily all disclosed inventive embodiments, there is provided: A method of monitoring a photovoltaic array with a plurality of strings of photovoltaic cells comprising the following steps: automatically electrically disconnecting at least one string from said combined set of strings to produce a modified set of strings; measuring electrical output characteristics of said modified set of strings; comparing said electrical output characteristics to a baseline value, to thereby ascertain the result of said disconnecting operation; and transmitting an alert if said comparing step shows that the electrical output characteristics found by said comparing step are outside of an expected range; and automatically electrically reconnecting said at least one string.

According to some but not necessarily all disclosed inventive embodiments, there is provided: A photovoltaic power generation system comprising: A plurality of photovoltaic cells; a power converter which is connected to groups of said photovoltaic cells through a plurality of switches; and control logic which operates said switches such that: during normal operation, most or all of said photovoltaic cells are connected to provide power to a power converter; at some but not all times during normal operation, some, but less than all, of said cells are automatically disconnected from power converter; wherein one or more diagnostic tests are run while some of said cells are disconnected.

According to some but not necessarily all disclosed inventive embodiments, there is provided: A photovoltaic power generation system comprising: Two or more strings of photovoltaic cells; A first circuit path with conductors switchably connected to each string of photovoltaic cells; A second circuit path with conductors switchably connected to each string of photovoltaic cells; Wherein first and second circuit paths are configured so that, in a first switchable configuration, corresponding to a normal operating mode, a positive end of each string of photovoltaic cells is connected to the first circuit path and in a second switchable configuration, corresponding to a safety mode, a positive end of one string and a negative end of a second strong are connected to said first circuit path and the opposite end of each string is connected to said second circuit path.

According to some, but not necessarily all disclosed inventive embodiments, there is provided: systems, devices, and methods for operating, monitoring and diagnosing photovoltaic arrays used for solar energy collection. The system preferably includes capabilities for monitoring or diagnosing an array by automatically disconnecting portions of the array during normal service (when load is not maximum, and observing the resulting change in electrical characteristics. More intensive diagnostic procedures can be launched if needed. One embodiment provides for performing monitoring or diagnostic operations on the array in daylight or at night. Another embodiment allows monitoring or diagnostic operations to be performed on a portion of the array while other parts of the array continue to collect energy. Yet another embodiment provides a safety mode for an array for maintenance or during emergencies.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

For example, while the preferred embodiment uses silicon photovoltaic diodes, other semiconductor materials can be used, e.g. $Si_{0.9}Ge_{0.1}$ or other SiGe alloys, or III-V or other semiconductor materials. Amorphous, polycrystalline, or single-crystal materials can be used.

A variety of structures have been proposed to gather solar energy, including structures using concentration, wavelength conversion, and multicolor (multi-bandgap) structures, and the disclosed inventions are applicable to all of these.

As noted above, the Universal Power Converter (UPC) topologies of WO2008/008143 are particularly advantageous, since they provide great flexibility in conversion of power from any portal to any other portal, in a multi-portal converter. However, this specific family of topologies is not required for most of the disclosed inventions. Many converter topologies can provide bidirectional (or multidirectional) transfer of power, even if the full flexibility of the UPC topologies is not present, and some of these bidirectional-power-transfer topologies can be used for some of the claimed inventions. (For example, a simple isolated buck-boost topology can be operated to provide bidirectional power transfer, e.g. as in starter/generator systems for aircraft engines.) Some of the disclosed inventions are useful even if a bidirectional converter is not present. Of course, a great variety of variations are possible within the basic UPC topology too.

The particular requirements of different applications can also be accommodated by appropriate customization of different portals of a single converter. For example, in some applications it might be useful to have a 12V DC output for standard automotive accessories, as well as a 48V DC output for connection to a battery bank, a 120V 60 Hz output for standard consumer or office appliances, and/or a 5V DC output for deicing through exposed connections.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be synergistically with the inventions claimed below, may be found in the following publications and applications: Balakrishnan et al., Soft switched ac link buck boost converter, in Applied Power Electronics Conference and Exposition 2008, pp. 1334-1339; Balakrishnan et al., Soft switched ac-link wind power converter, in IEEE International Conference on Sustainable Energy Technologies 2008, pp. 318-321; Toliyat et al., Soft switched ac-link AC/AC and AC/DC buck-boost converter, in Power Electronics Specialists Conference 2008 pp. 4168-4176; and U.S. application Ser. Nos. 13/205,243 (pending), which is a continuation of Ser. No. 12/479,207 (pending, and published as US 2010-0067272), which is a continuation of Ser. No. 11/759,006 (now issued as U.S. Pat. No. 7,599,196), which is a nonprovisional extension of 60/811,191 filed Jun. 6, 2006 (and now expired); WO 2008/008143; and U.S. Pat. No. 7,778,045. All of these applications have at least some common ownership, copendency, and inventorship with the present application, and all of them are hereby incorporated by reference.

The claims as filed are intended to be as comprehensive as possible, and NO subject matter is intentionally relinquished, dedicated, or abandoned.

What is claimed is:

1. A method of operating a photovoltaic power system, comprising:
   during normal operation, providing power from a plurality of photovoltaic cells to a power converter;
   automatically, at some but not all times during normal operation, electrically disconnecting some, but less than all, of said cells from a power converter, and performing at least one diagnostic test;
      wherein said diagnostic test uses a bidirectional AC-DC converter to apply a DC potential to said at least one string of photovoltaic cells; and,
      wherein said diagnostic test performs an IV curve trace on ones of said cells; and,
   automatically electrically reconnecting the one or more strings.

2. The method of claim 1, wherein said steps are repeated, from time to time during normal operation, for each said string.

3. The method of claim 1, wherein said automatically disconnecting step is performed at regular intervals.

4. The method of claim 1, wherein said automatically disconnecting step is performed only when electrical load is below a ceiling value.

* * * * *